United States Patent
Hasegawa et al.

(10) Patent No.: US 6,724,831 B1
(45) Date of Patent: Apr. 20, 2004

(54) PRE-DISTORTION APPARATUS AND METHOD THEREOF

(75) Inventors: Tsuyoshi Hasegawa, Kanagawa (JP); Toru Maniwa, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/438,131

(22) Filed: Nov. 10, 1999

(30) Foreign Application Priority Data

Jan. 7, 1999 (JP) .......................................... 11-002267

(51) Int. Cl.[7] .......................... H04K 1/02; H04L 25/03; H04L 25/49
(52) U.S. Cl. ........................................ 375/297; 375/296
(58) Field of Search ................................ 375/296, 277, 375/278; 348/608; 455/126, 63; 316/512

(56) References Cited

U.S. PATENT DOCUMENTS

| | | | | |
|---|---|---|---|---|
| 5,524,286 A | * | 6/1996 | Chiesa et al. | 455/126 |
| 5,852,630 A | * | 12/1998 | Langberg et al. | 375/219 |
| 6,236,837 B1 | * | 5/2001 | Midya | 455/63 |
| 6,426,865 B2 | * | 7/2002 | Kasahara et al. | 361/512 |

* cited by examiner

*Primary Examiner*—Stephen Chin
*Assistant Examiner*—Curtis Odom
(74) *Attorney, Agent, or Firm*—Katten Muchin Zavis Rosenman

(57) ABSTRACT

In order to linearize the input/output characteristic of a power amplifier, a pre-distortion is performed using a pre-distortion function obtained from the inverse function of the input/output characteristic, in which the inclination of the highly linear low power part of this input/output characteristic is maintained. When the pre-distortion function is digitized and stored in a table, a differential between the pre-distortion function and a function of y=x is obtained, and a function table indicating this differential is stored. Since the gently inclined part of the pre-distortion function equals a function y=x, it is sufficient if only the difference between the input signal and function y=x is digitized, thereby realizing the reduction of the quantization error.

8 Claims, 20 Drawing Sheets

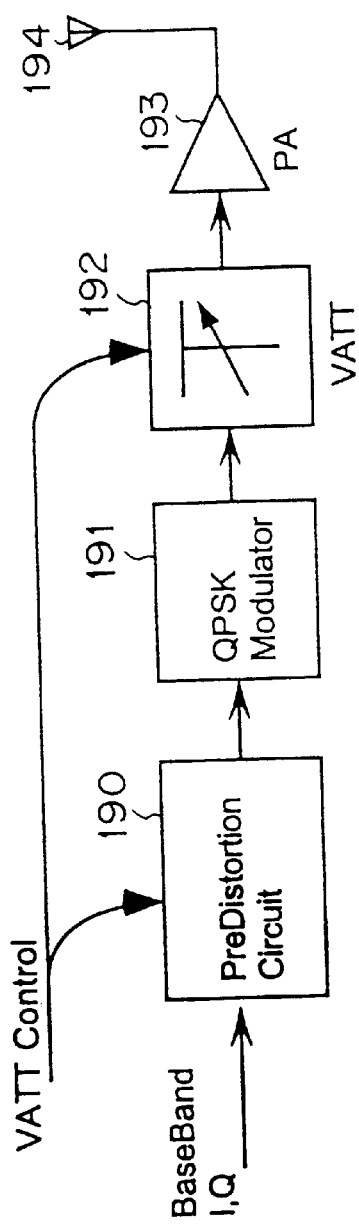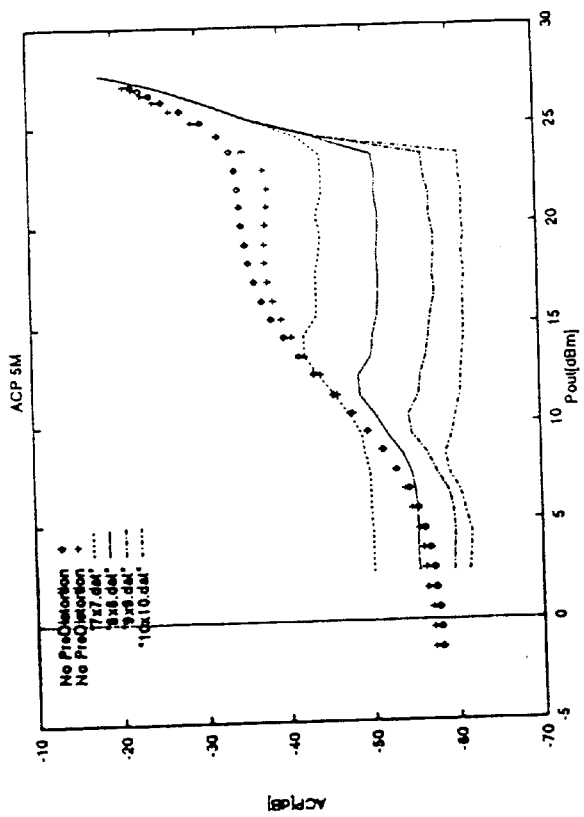
FIG. 3A PRIOR ART
FIG. 3B PRIOR ART

US 6,724,831 B1

PRE-DISTORTION APPARATUS AND METHOD THEREOF

BACKGROUND OF THE INVENTION

1. Field of the Invention

The present invention relates to a technology for linearizing the input/output characteristic of a power amplifier.

2. Description of the Related Art

In mobile radio communications, since a signal in an unused band interferes with an adjacent channel, it is necessary to secure the linearity of a power amplifier in order to suppress the signal power in an unused band to a lower level. Although conventionally an output back-off method for suppressing an output power in such a way that out-of-band power becomes sufficiently low is used for this purpose, it is difficult to improve its linearity while securing the efficiency since this method has a trade-off between the efficiency and the linearity.

FIG. 1 shows the input/output characteristic of a typical power amplifier.

The output back-off method is described with reference to FIG. 1.

As the output of a power amplifier becomes high, as shown in (1) of FIG. 1, the relationship between the input and output of the power amplifier deviates from a linearity relationship, as shown in (2) of FIG. 1. Therefore, in the output back-off method, only the low input part of the characteristic curve (1) of an actual power amplifier in which the linearity is secured is used. Since as shown in FIG. 1, the low input part of the characteristic curve of a power amplifier yields an almost ideal characteristic curve (2), sufficient linearity can be obtained from the operation of a power amplifier, and the occurrence of an RF element due to the degradation of the waveform of a signal to be amplified, specifically the occurrence of noise in an adjacent channel can be suppressed to a low level.

However, since if the input of a power amplifier is low, the amplification efficiency of the power amplifier becomes low and the power amplifier cannot be used efficiently enough, which is a problem. In order to improve the amplification efficiency, the input must be increased, which leads to non-linearity in the power amplifier. Thus, since the output back-off method has a trade-off between the efficiency and the linearity, it is difficult for the high efficiency and linearity to exist together.

As a method for improving the linearity while securing the amplification efficiency of a power amplifier, a linearization by a pre-distortion method is attempted. For detailed information about this method, please see the specification of Japanese Patent Application 9-297297 previously applied for by this applicant.

FIGS. 2A and 2B are drawings showing a pre-distortion method.

As shown in FIG. 2A, if a pre-distortion is performed for the input/output characteristic of a power amplifier (PA), a baseband I signal and a baseband Q signal are inputted to a baseband variable attenuator 180, the power of baseband signals are adjusted, and the baseband signals are inputted to a pre-distortion circuit 181. In the pre-distortion circuit 181, the low input part of an inputted signal in which the linearity shown in the curve (1) of FIG. 1 is pre-processed using a function adjusted in such a way that the inclination of the characteristic curve can be maintained, based on the inverse function of the input/output characteristic of a power amplifier 183 as shown in the curve of FIG. 1. Specifically, no special treatment is made for the inputted baseband signals while the input value of the input baseband signals are within the range where the input/output characteristic of the power amplifier 183 shows linearity. However, if the input/output characteristic is out of the range where the input/output characteristic of a power amplifier 183 shows non-linearity, the power value of the inputted baseband signals are increased, and the degradation of the signal waveform due to the increase of the non-linearity of the power amplifier 183 is cancelled. The baseband signals pre-distorted by the pre-distortion circuit 181 are inputted to a modulator (in FIG. 1, a WPSK modulator 182) and QPSK-modulated. By QPSK modulation, the pre-distorted signals are converted to RF signals, are amplified by the power amplifier 183, and are transmitted from an antenna 184. It is because a pre-distortion is performed by a digital signal process that the pre-distortion circuit 181 is installed immediately before the QPSK modulator. Specifically, if the pre-distortion circuit 181 is installed immediately after the QPSK modulator, signals are converted to RF signals and it becomes difficult to pre-distort the signals by a digital process.

If the pre-distortion method is realized using a digital circuit and if a wide power range is covered only by a digital signal process with a configuration as shown in FIG. 2A, the quantization error increases at a low power, and an adjacent channel leak power (ACP) characteristic significantly degrades. Specifically, the values of a function for applying a pre-distortion function, such as $F_{pd}(x)$ shown in FIG. 4 are discretized, and if those values are stored in a table and a value corresponding to an inputted signal value is read from the table, the discretization against the inclination of the function of a signal corresponding to the low signal input part of the function with a gentle inclination becomes too steep, and a pre-distortion with a large error is applied against an input signal value changing like as analog signal.

FIG. 2B shows an adjacent channel leak power (ACP) against the output of the power amplifier 183. In FIG. 2B, the vertical axis and horizontal axis are ACP (unit: dB) and the output of the power amplifier 183 (unit: dBm), respectively.

If a pre-distortion is not performed, as indicated by 0 and + in FIG. 2B, it has been found that as the output power $P_{out}$ of the power amplifier increases, the adjacent channel leak power (ACP) increases. However, ACPs in the case where a pre-distortion is performed are indicated using a variety of lines (a dotted line, a one-point chained line, etc.,). Each line shown in FIG. 2B indicates with how many bits a pre-distortion function is digitized (discretized), specifically, cases of 7 bits, 8 bits, 9 bits, 10 bits, 11 bits and 12 bits are indicated from the top. As shown in FIG. 2B, as the number of bits to be used when a pre-distortion function is digitized increases, the ACP is further improved.

Thus, although increasing the number of input/output bits to be used when a pre-distortion function is discretized, is considered in order to improve an ACP, in that case, the circuit scale becomes large.

Although in the configuration shown in FIG. 2B, the attenuation characteristic of a variable attenuator (VATT) 180 is not taken into consideration, the attenuation of the variable attenuator further degrades the ACP, which is another problem.

FIGS. 3A and 3B show the configuration and characteristic in the case where compensation is made by pre-distortion and where the attenuation characteristic of a variable attenuator is also taken into consideration.

According to the configuration shown in FIG. 3A, a pre-distortion is performed for baseband I and baseband Q signals in a pre-distortion circuit 190, and the signals are modulated in a QPSK modulator 191. Then, the signal power of the signals is attenuated in a variable attenuator 192, is amplified in a power amplifier PA 193 and the RF signals are transmitted from an antenna 184. At this time, an attenuation-degree control signal, VATT control provided to the variable attenuation 180 is inputted to the pre-distortion circuit 190, and a pre-distortion is applied taking into consideration the attenuation characteristic of the variable attenuator 192.

FIG. 3B shows the relationship between an output value to a PA 193 and an ACP in the configuration shown in FIG. 3A.

The meaning of each curve shown in FIG. 3B is the same as that shown in FIG. 2B. As is clearly seen from FIG. 3B, if a pre-distortion is applied, an ACP characteristic is further improved than when the pre-distortion not applied. The greater the number of bits to be used when a pre-distortion function is digitized, the more the ACP characteristic is improved. If an ACP characteristic in the case where a pre-distortion is applied, as shown in FIG. 2B, is compared with an ACP characteristic in the case where a pre-distortion is applied, as shown in FIG. 3B, it is found that the ACP characteristic in a configuration where the attenuation characteristic of the variable attenuator is also taken into consideration is more improved, as shown in FIG. 3A.

Therefore, if an output is adjusted by the variable attenuator 192 in a configuration as shown in FIG. 3A, the performance can be secured with fewer input/output bits, as shown in FIG. 3B. However, in such a configuration, since it becomes necessary to switch over pre-distortion information according to the attenuation level of the variable attenuator 192, as a result, the circuit scale cannot be reduced dramatically.

In particular, since in a case where this method is applied to a mobile radio terminal, both a small size and light weight and a low power consumption becomes worthwhile targets, the circuit scale must be reduced by contracting pre-distortion information by a simple method for preventing the circuit scale from increasing.

SUMMARY OF THE INVENTION

The objective of the present invention is to provide an apparatus and method for making a high-accuracy pre-distortion without the increase of the circuit scale.

The pre-distortion apparatus of the present invention for linearizing the input/output characteristic of a power amplifier comprises a differential pre-distortion unit using a differential between a pre-distortion function to linearize the input/output characteristic of the power amplifier and a function expressed by a prescribed equation as a differential pre-distortion function in the pre-distortion apparatus and generating a differential pre-distortion signal for an inputted signal using the differential pre-distortion function, and a combination unit combining the differential pre-distortion signal with the inputted signal and outputting the combined signal as a signal after pre-distortion.

The pre-distortion method of the present invention for linearizing the input/output characteristic of a power amplifier comprises the steps of (a) using the differential between a pre-distortion function to linearize the input/output characteristic of the power amplifier and a function expressed by a prescribed equation as a differential pre-distortion function in the pre-distortion apparatus and generating a differential pre-distortion signal for an inputted signal using the differential pre-distortion function, and (b) combining the differential pre-distortion signal with the inputted signal and outputting the combined signal as a signal after pre-distortion.

According to the present invention, since a pre-distortion function with a steep inclination is converted to a differential pre-distortion function which is obtained using the differential between the function and another appropriate function, and the converted differential pre-distortion function is digitized and stored, information about the differential pre-distortion function can be accurately digitized using a small number of bits when the function table of the differential pre-distortion function is generated.

Therefore, when a pre-distortion is performed using this function table, the quantization error can be reduced and simultaneously the memory capacity of a memory device for storing the function table can be reduced since the number of bits required to store the information can be reduced. Thus, the circuit scale of a pre-distortion circuit can be reduced. Accordingly, a high-accuracy pre-distortion apparatus can be realized with a small-scale configuration.

BRIEF DESCRIPTION OF THE DRAWINGS

FIGS. 3A and 3B show the configuration and characteristic in the case where compensation is made using pre-distortion including the attenuation characteristic of a variable attenuator.

DESCRIPTION OF THE PREFERRED EMBODIMENTS

According to the present invention, in order to reduce the scale of a digital signal process circuit used in a pre-distortion method, the memory capacity of a function table is reduced by storing only the differential between a pre-distortion signal and an input signal in a memory device. The memory capacity of a function table is further reduced by separating this differential function into an approximation function and the correction function of the approximation function and storing only information of the correction function in the memory device.

In this case, two methods are available: one method for processing after converting complex baseband I and Q signals into an amplitude and a phase, respectively, and the other for processing without converting the complex baseband I and Q signals into an amplitude and a phase, respectively. If the complex baseband I and Q signals are converted into an amplitude and a phase, respectively, the memory capacity of a function table can be further reduced.

Figure 4:
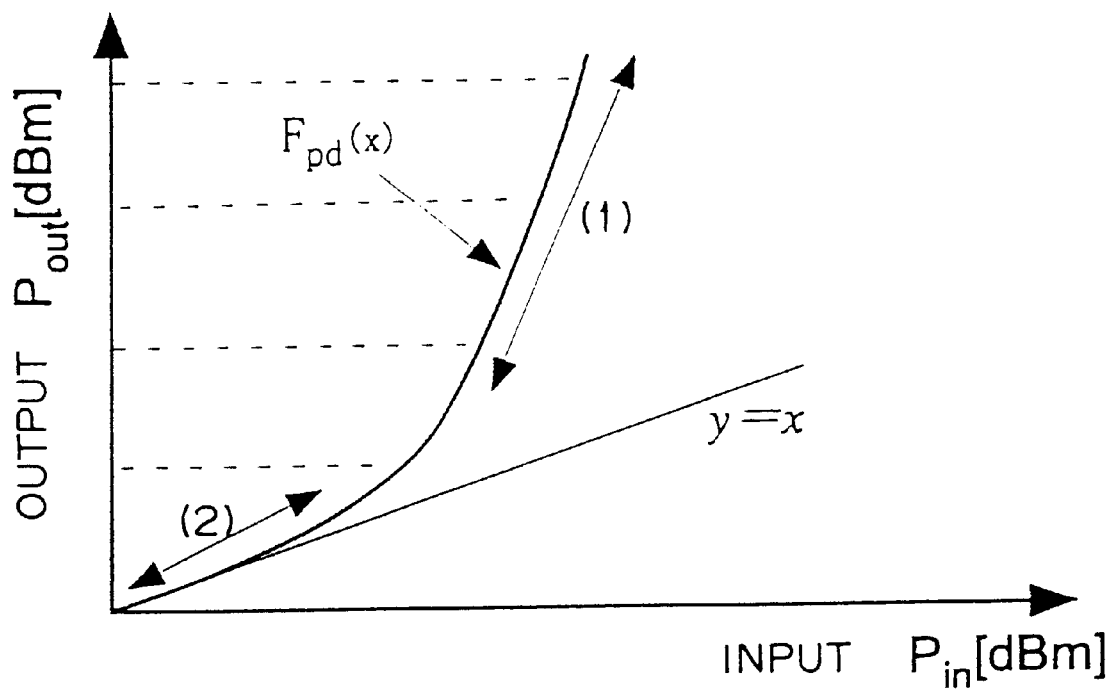
FIG. 4 shows the basic principle of the preferred embodiment of the present invention (No. 1).
Figure 5:
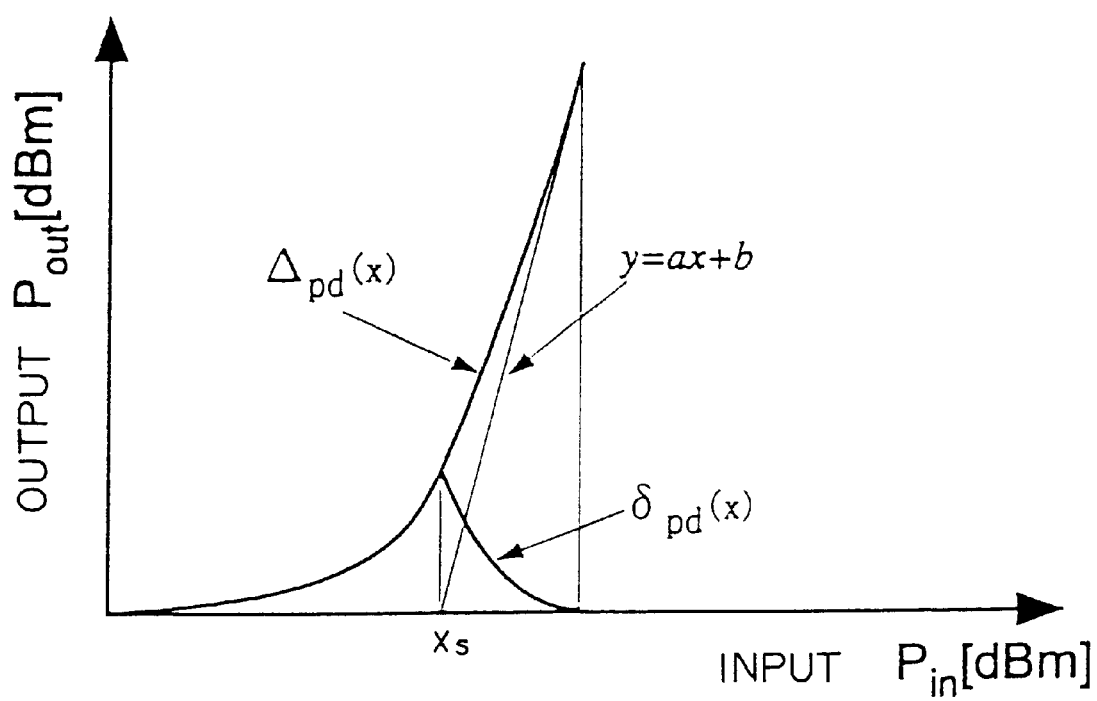
FIG. 5 shows the basic principle of the preferred embodiment of the present invention (No. 2).

FIGS. 4 and 5 show the basic principle of the preferred embodiment of the present invention.

Figure 1:
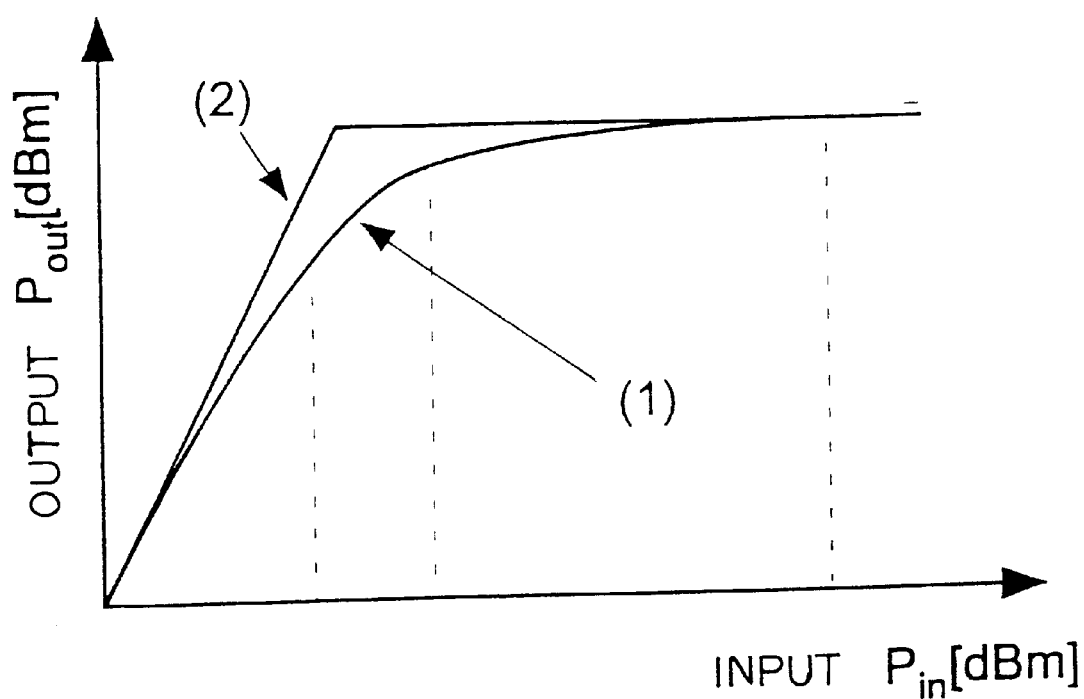
FIG. 1 shows the input/output characteristic of a power amplifier.

$F_{pd}(x)$ shown in FIG. 4 is a pre-distortion function needed to linearize a power amplifier having a characteristic, as shown in (1) of FIG. 1, as shown in (2) of FIG. 1, and this function $F_{pd}(x)$ can be obtained by multiplying the inverse function of a function showing the input/output characteristic shown in (1) of FIG. 1 by a constant. When an input is low, the function $F_{pd}(x)$ shows a relatively gentle inclination, and when the input increases to a certain level, the function becomes large and shows a steep inclination. In an actual circuit, an upper limit is set at the maximum output value of a PA. However, in order to improve the efficiency of the PA, it is necessary to set the upper limit to a certain high level.

In the case where the function $F_{pd}(x)$ is discretized and used, there is a problem that since most of the discretized information is assigned to a steep part (1), a substantial number of quantization bits cannot be secured in a part (2) with a narrow amplitude. In FIG. 4, since the part (2) is a quarter of the whole, approximately two quantization bits are lost in this part, which leads to the degradation of the characteristic at the time of a small signal.

Specifically, as shown by four dotted lines in FIG. 4, if the output value of the PA, $P_{out}$, is discretized at four levels, three descrete values are provided in the part (1), and one of the three discrete values can be outputted for the change of the input value of the PA, $P_{in}$. However, in the part (2), since the inclination of a graph is not steep, only one discrete value can be assigned. Therefore, even if the input value of the PA, $P_{in}$, changes, the digitized function $F_{pd}(x)$ outputs only one special value for the part (2). In this way, when being digitized, the pre-distortion function $F_{pd}(x)$ cannot output a correct value. This phenomenon causes a quantization error and degrades the adjacent channel leak power (ACP) characteristic.

For this reason, the whole pre-distortion function are not stored, and only a differential between the pre-distortion function and the input signal is stored. Specifically, a function $\Delta_{pd}(x)=F_{pd}(x)-x$ only for the differential obtained by subtracting $y=x$ from $F_{pd}(x)$ is discretized and used. Since a function $y=x$ outputs an input x without modification as an output y, actually the function indicates the input signal without modification. Since as shown in FIG. 4, the input signal can be processed separately by subtracting the function $y=x$ from the pre-distortion function $F_{pd}(x)$, in particular, a characteristic in the case of a narrow amplitude (part (2) shown in FIG. 4) can be improved. In the following description, $\Delta_{pd}(x)$ is often expressed as a $\Delta$ function for simplification.

FIG. 5 shows a method for further separating and expressing the differential function $\Delta_{pd}(x)$ between the pre-distortion function $F_{pd}(x)$ and the input signal obtained as described above.

Since as shown in FIG. 5, there remains a part with a steep inclination in $\Delta_{pd}(x)$, many of the bits of an output are used to express the steeply-inclined part, and the digitalization accuracy of a gently inclined part is not high. Therefore, attention is paid to the fact that the inclination of the steeply inclined part changes little, and for the part a differential between a straight line $y=ax+b$ and the input signal is used instead of the differential between the pre-distortion function $F_{pd}(x)$ and the input signal. Since the amplitude (range of output values $P_{out}$) of the correction function $\delta_{pd}(x)$ (hereinafter called a $\delta$ function for simplicity) which is obtained as a result of such a process, is reduced compared with the original $\delta_{pd}(x)$, many bits can be assigned within a narrow output range, and simultaneously the correction function $\delta_{pd}(x)$ can be digitized using the fewer bits compared with the case where the entire output range of the original pre-distortion function $F_{pd}(x)$ is digitized. As a result, the necessary memory capacity can be reduced. The original pre-distortion function $F_{pd}(x)$ can be expressed as follows using $\delta_{pd}(x)$.

$$F_{pd}(x)=x+\Delta_{pd}(x) \qquad (1)$$

$$\Delta_{pd}(x) = \begin{cases} \delta_{pd}(x) & (0 \le x \le x_S) \\ \delta_{pd}(x) + ax + b(x_S \le x) \end{cases} \qquad (2)$$

All operations expressed using these equations are sums or products, and those operation circuits can be realized with a relatively small-scale circuit. The operations can also be performed by way of software. a, b and x are constants which are appropriately determined when a $\delta$ function is prepared.

Figure 2A:
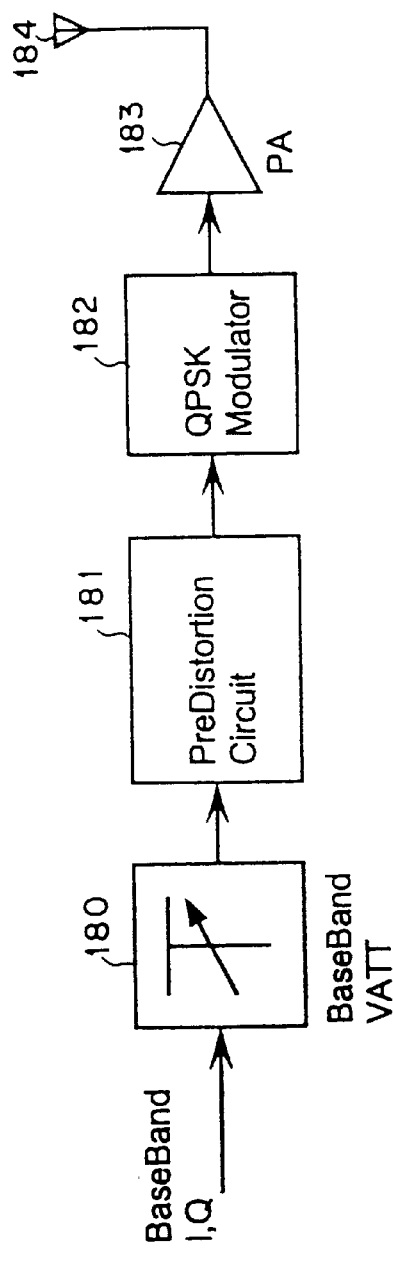
FIGS. 2A an 2B are drawings showing a pre-distortion method.
Figure 2B:
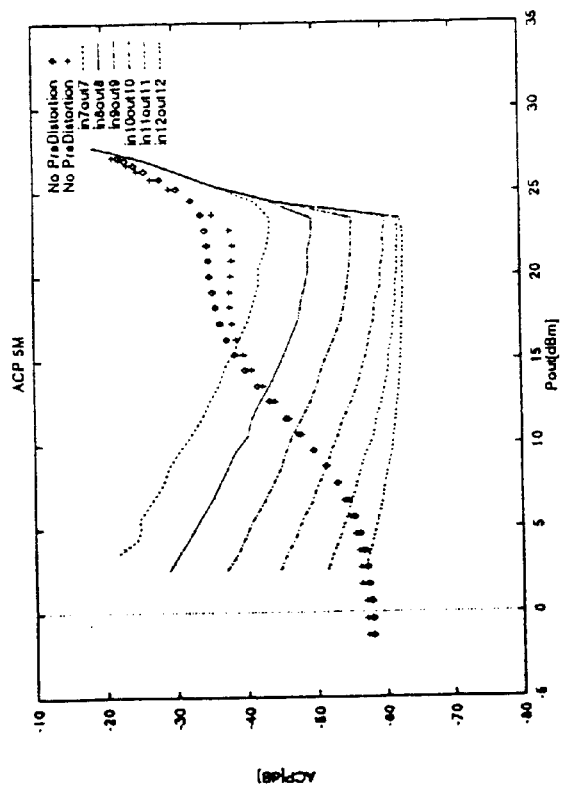

Furthermore, as shown in FIGS. 2A and 2B, if compensation is made taking into consideration not only the non-linearity of a power amplifier, but also the non-linearity of a QPSK modulator, gain control amplifier (AGC: or a power amplifier PA), frequency mixer and variable attenuator, the overall linearity can be improved without the increase of the circuit scale.

Figure 6A:
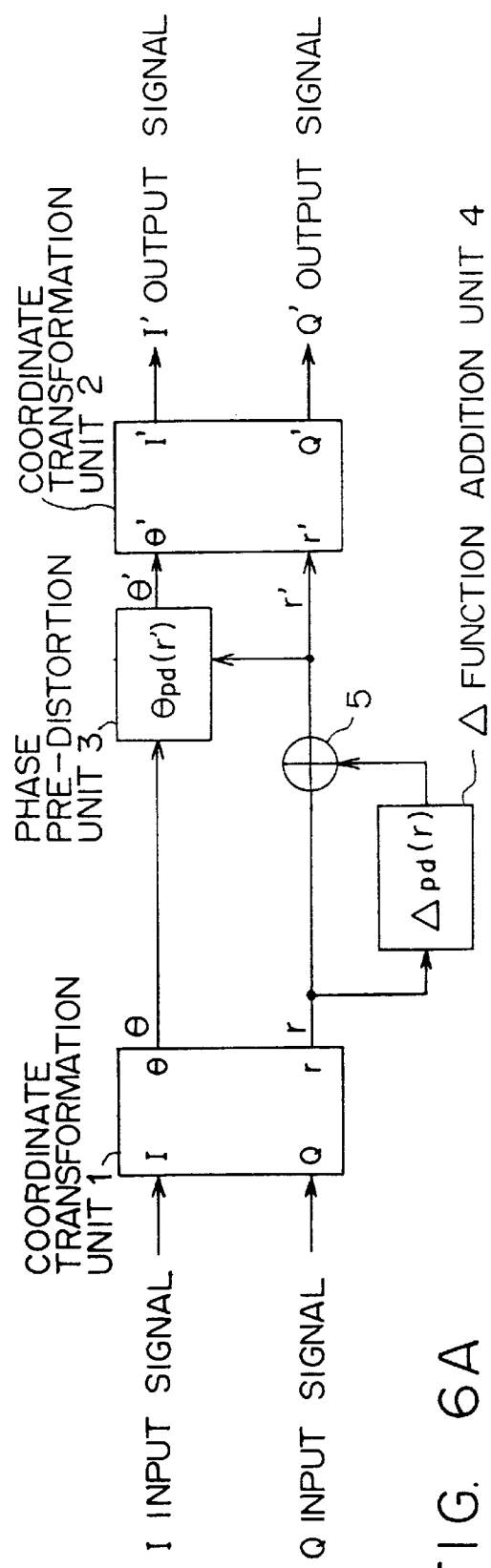
FIGS. 6A and 6B show the configuration of the first preferred embodiment of the pre-distortion circuit of the present invention.
Figure 6B:
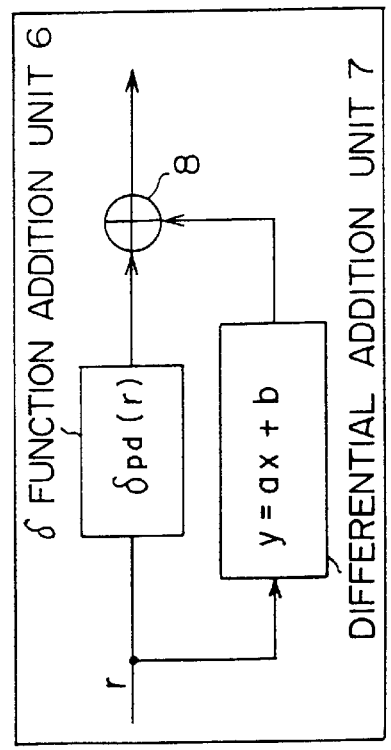

FIGS. 6A and 6B show the configuration of the first preferred embodiment of the pre-distortion circuit of the present invention.

This preferred embodiment is configured without taking the non-linearity of a variable attenuator into consideration. First, in FIG. 6A, an I signal is inputted to the terminal I of a coordinate transformation unit 1. Similarly, a Q signal is inputted to the terminal Q of the coordinate transformation unit 1. In the coordinate transformation unit 1, the inputted I and Q signals are regarded as the coordinates values of a vector on an I-Q plane, and are converted into polar coordinates (r, θ) expressed using both an amplitude r and a phase θ. If the signal value of the I signal and the signal value of the Q signal with I and Q, respectively, are expressed, (I, Q) and (r, θ) are related to each other according to the following equations (3) and (4).

$$r = \sqrt{I^2 + Q^2} \quad (3)$$

$$\tan\theta = \frac{Q}{I} \quad (4)$$

The coordinate transformation unit 1 is comprised of a multiplier, an adder, a divider, a table storing square root values and a table storing tan function values. First, the coordinate transformation unit 1 calculates the square of the I signal value and the square of the Q signal value using the multiplier. Then, the two squared values are added using the adder, and an r value expressed by equation (3) is calculated for each of the squared values referring to a table in which the square root values are stored. Then, the coordinate transformation unit 1 divides the Q signal value by the I signal value with the divider, refers to a table for the tan function and obtains the θ value. These calculations can also be made by way of software.

The r and θ values obtained in this way are outputted from the terminals r and θ, respectively, of the coordinate transformation unit 1. Then, the r value is inputted to an adder 5, and is also inputted to a Δ function addition unit 4 for outputting the Δ function value described earlier. The adder 5 adds the r value and a Δ function value corresponding to the r value inputted from the Δ function addition unit 4. This operation corresponds to the calculation of equation (1). Then, the amplitude value (r' value) for which a pre-distortion process is executed by the adder 5 is inputted to the r' terminal of a coordinate transformation unit 2. According to this preferred embodiment, pre-distortion is performed for not only the r value, but also for phase distortion provided by an PA.

The pre-distortion for a phase θ is as follows.

If a characteristic on both the amplitude and phase of a PA is compensated for by way of pre-distortion, it is assumed that a characteristic on the amplitude and a characteristic on the phase of the PA are f and φ, respectively, and that the complex values of I and Q signals inputted to the PA is expressed with r·exp(jθ). j is the imaginary unit. Then, a signal which has passed through the PA can be expressed as f(r)·exp(j(θ+φ(r))). Then, if it is assumed that the primary term of the power series development of f(r) has become $c_1$ r ($c_1$ is an arbitrary constant), the following function is considered for pre-distortion.

$$r' = f^{-1}(c_1 r) = F_{pd}(r)$$

$$\theta' = \theta - \phi(r') = \theta_{pd}(r') \quad (5)$$

Then, the signal inputted to the PA becomes r'·exp(jθ'), and the output signal of the PA becomes f(r')·exp(j(θ'+φ(r'))) If this output signal is transformed using equation (5), the following equation is obtained.

$$V_{out} = f(r')\exp(j(\theta'+\phi(r')))$$

$$= f(f^{-1}(c_1 r))\exp(j(\theta-\phi(r')+\phi(r')))$$

$$= c_1 r \exp(j\theta) \quad (6)$$

In equation (6), $V_{out}$ is the output of the PA. Therefore, if the pre-distortion function is defined using equation (5) for both an amplifier r and a phase θ, a constant-multiplied ($c_1$-multiplied) output of the original input r·exp(jθ) can be obtained. Specifically, the characteristic of the PA can be linearized. As is clearly seen from equation (5), it is found that although a pre-distortion function for the amplitude r, $F_{pd}(r)$ can be obtained by changing the inclination of the inverse function of the characteristic of the PA, $f^{-1}(r')$ by $c_1$, a pre-distortion function for phase $\theta_{pd}(r')$ can be obtained by subtracting the phase characteristic φ(r') of the PA from the phase θ of the signal without modification.

Therefore, a phase pre-distortion unit 3 subtracts the phase characteristic φ(r') of a circuit to be compensated for (not limited to an PA) from the phase value θ inputted from the coordinate transformation unit 1, and outputs the result as a phase value after pre-distortion. Specifically, θ−φ(r')= $\theta_{pd}(r')$ is satisfied. The phase value after pre-distortion θ' obtained in this way is inputted to the terminal θ' of the coordinate transformation unit 2. Since the phase pre-distortion function $\theta_{pd}(r')$ does not have a very steeply inclined part and the phase characteristic of a PA, etc., varies for each product, the phase pre-distortion function $\theta_{pd}(r')$ should be measured and determined by experiments, etc. case by case. If the phase pre-distortion function of a product has a steep inclination, it is desirable to also apply the same process as executed for the amplitude pre-distortion function to the phase pre-distortion function. The coordinate transformation unit 2 executes the reverse of the process executed for both r' and θ' in the coordinate transformation unit 1, and outputs I' and Q' signals, respectively. The process in the coordinate transformation unit 2 can be expressed as follows.

$$I'=r'\cos\theta', \quad Q'=r'\sin\theta' \quad (7)$$

In equation (7), I' and Q' are an I signal value after pre-distortion and a Q signal value after pre-distortion, respectively. Each θ of both the cos function and sin function is stored in a table, etc., and a target signal value can be obtained by reading the table, etc.

FIG. 6B shows the internal configuration of a Δ function addition unit 4. As shown in equation (2), a Δ function is obtained by adding a differential between the δ function and y=ax+b to the δ function, which is a final pre-distortion function. Therefore, in FIG. 6B, a δ function value $\delta_{pd}(r)$ is outputted by a δ function addition unit 6 against an input amplitude value. Simultaneously, a differential addition unit 7 is provided, and if the amplitude value exceeds a prescribed value (in equation (2), $x_s$ or more), a differential (=ax+b) is inputted from the differential addition unit 7 to an adder 8, is added to the δ function value and is outputted from the differential addition unit 7. In an equation of the form y=ax+b, x equals the input amplitude value r, a and b are coefficient values appropriately selected when the δ function is prepared, and y is an output amplitude value.

As described above, with the configuration shown in FIGS. 6A and 6B, I' and Q' output signals can be obtained by applying a pre-distortion to the I and Q input signals. Since the output range of the δ function is narrow, the number of bits needed to digitize the descrete value of the digitized δ function stored in the δ function addition unit 6 can be reduced, and also the quantization error can be reduced. Therefore, the memory capacity can be reduced, thus realizing the reduction of the circuit scale and a high-accuracy pre-distortion.

Figure 7:
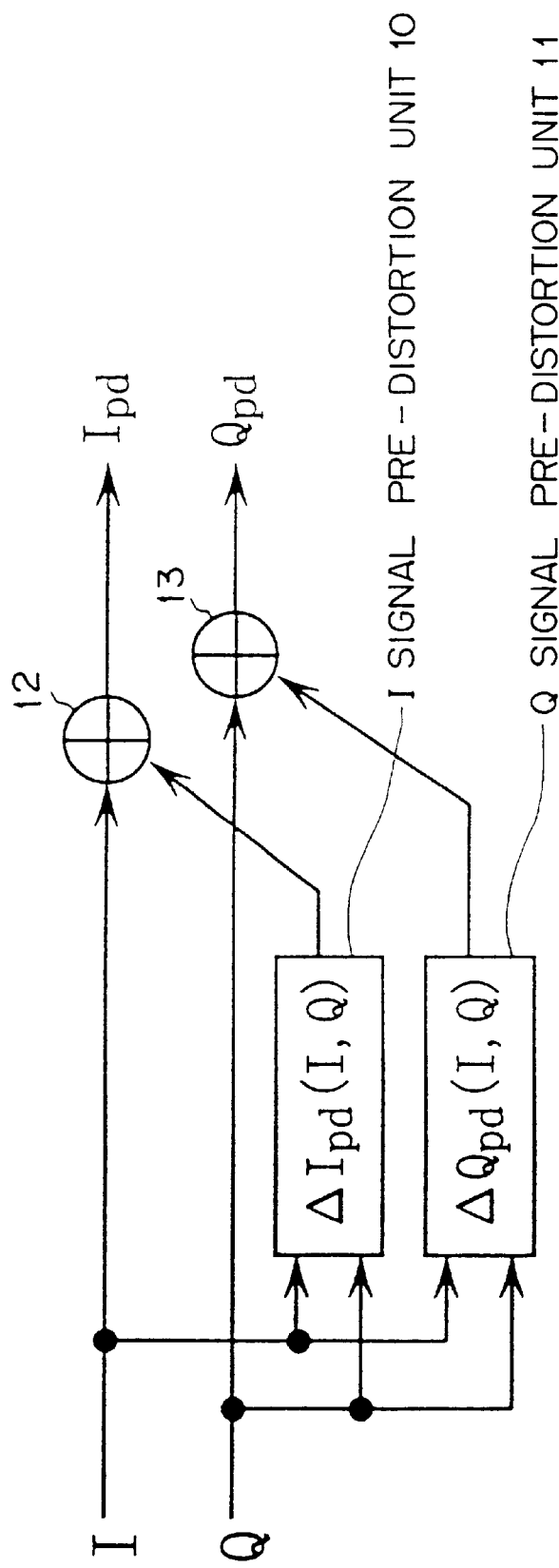
FIG. 7 shows the configuration of the second preferred embodiment of the pre-distortion circuit of the present invention.

FIG. 7 shows the configuration of the second preferred embodiment of the pre-distortion circuit of the present invention.

Although in the first preferred embodiment shown in FIGS. 6A and 6B, after I and Q signals are converted into an amplitude r and a phase θ, respectively, a pre-distortion is applied to the amplitude and phase. In the second preferred embodiment, a pre-distortion is applied to I and Q signals without converting I and Q signals into r and θ, respectively.

Then, an I signal pre-distortion unit 10 performs pre-distortion for an I signal, and a Q signal pre-distortion unit 11 performs pre-distortion for a Q signal. In FIGS. 6A and 6B, two pieces of the degree of pre-distortion are expressed as $\Delta I_{pd}(I, Q)$ and $\Delta Q_{pd}(I, Q)$. Function $\Delta I_{pd}(I, Q)$ and $\Delta Q_{pd}(I, Q)$ are defined as follows using both $F_{pd}(x)$ and a phase pre-distortion function $\theta_{pd}(x)$.

$$\Delta I_{pd}(I, Q) = F_{pd}\left(\sqrt{I^2 + Q^2}\right)\cos(\theta_{pd}(I, Q)) - I \quad (8)$$

$$\Delta Q_{pd}(I, Q) = F_{pd}\left(\sqrt{I^2 + Q^2}\right)\sin(\theta_{pd}(I, Q)) - Q \quad (9)$$

In equations (8) and (9), I and Q indicate the signal values of the I and Q signals, respectively. As shown in equations (1) and (2), for $F_{pd}(x)$, only a δ function is digitized (discretized) and stored in a table format, and the other operations are performed by a calculator using the original I and Q signals to obtain a final function value. In this way, as described earlier, the steeply inclined part of the differential pre-distortion function $\Delta_{pd}(x)$ is stored by a correction function $\delta_{pd}(x)$, and the memory capacity is reduced by utilizing the fact that the output range of the $\delta_{pd}(x)$ is narrow. Simultaneously, the accuracy of the digitalization is improved. As for both cos and sin functions, tables are also prepared, and function values are read from the tables.

In this way, the signal values generated in the I signal pre-distortion unit 10 and the Q signal pre-distortion unit 11 are added to the I and Q signals by adders 12 and 13, respectively, and are outputted as signals after pre-distortion $I_{pd}$ and $Q_{pd}$. The I signal pre-distortion unit 10 and Q signal pre-distortion unit 11 can also be realized by way of software.

Figure 8:
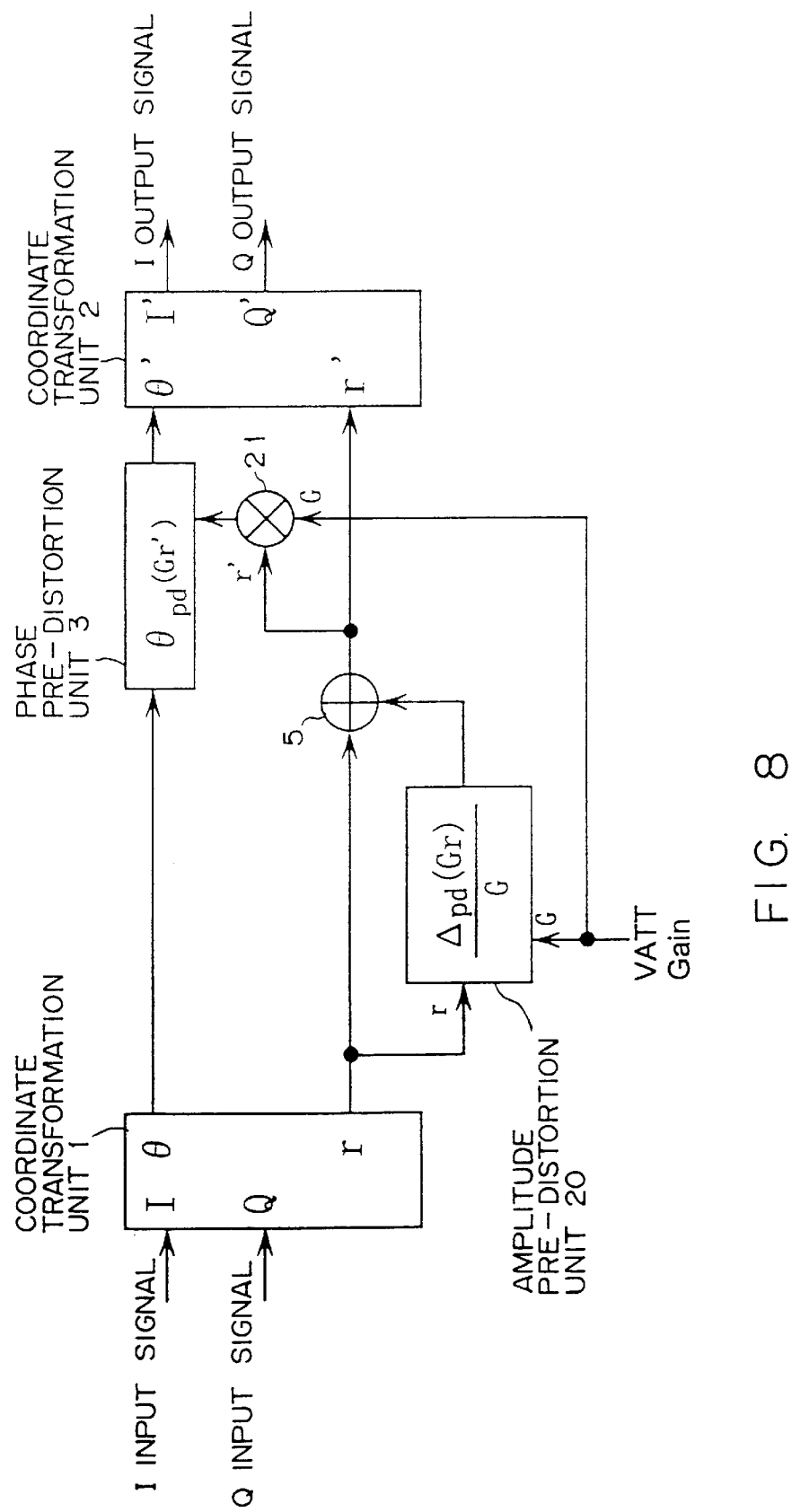
FIG. 8 shows the configuration of the third preferred embodiment of the pre-distortion circuit of the present invention.

FIG. 8 shows the configuration of the third preferred embodiment of the pre-distortion circuit of the present invention.

In FIG. 8, the same reference numbers are attached to the same elements as those used in FIGS. 6A and 6B.

I and Q input signals inputted to the coordinate transformation unit 1 are converted into an amplitude signal r and a phase signal θ, respectively. The amplitude signal r is inputted to an adder 5 and is also inputted to an amplitude pre-distortion unit 20. The amplitude pre-distortion unit 20 receives the amplitude signal r as an input and outputs $(\Delta_{pd}(Gr))/G$. G is the gain of a variable attenuator installed in the latter stage of the pre-distortion circuit shown in FIG. 8, which is not shown in FIG. 8. The gain G is inputted from the control circuit of the variable attenuator to both the amplitude pre-distortion unit 20 and a multiplier 21. The output of the amplitude pre-distortion unit 20 is added to the amplitude signal r in an adder 5, and the addition result is inputted from the adder 5 to the terminal r' of the coordinate transformation unit 2 as amplitude signal after pre-distortion r'. An amplitude signal r' is also inputted to the multiplier 21, and after being multiplied by the gain G of the variable attenuator in the multiplier 21, the amplitude signal r' is inputted to the phase pre-distortion unit 3. The phase pre-distortion unit 3 calculates the degree of phase pre-distortion $\theta_{pd}(Gr')$ by which the phase characteristics of phase signal θ and other component elements, such as the variable attenuator, etc., are corrected based on an amplitude signal after pre-distortion Gr' obtained by multiplying amplitude signal r' by the gain G of the variable attenuator, and inputs the amount of phase pre-distortion to the terminal θ' of the coordinate transformation unit 2 as a signal after pre-distortion θ'.

The coordinate transformation unit 2 generates and outputs an I signal after pre-distortion I' and a Q signal after pre-distortion Q' based on the inputted amplitude r' and phase signal θ', respectively.

Figure 9:
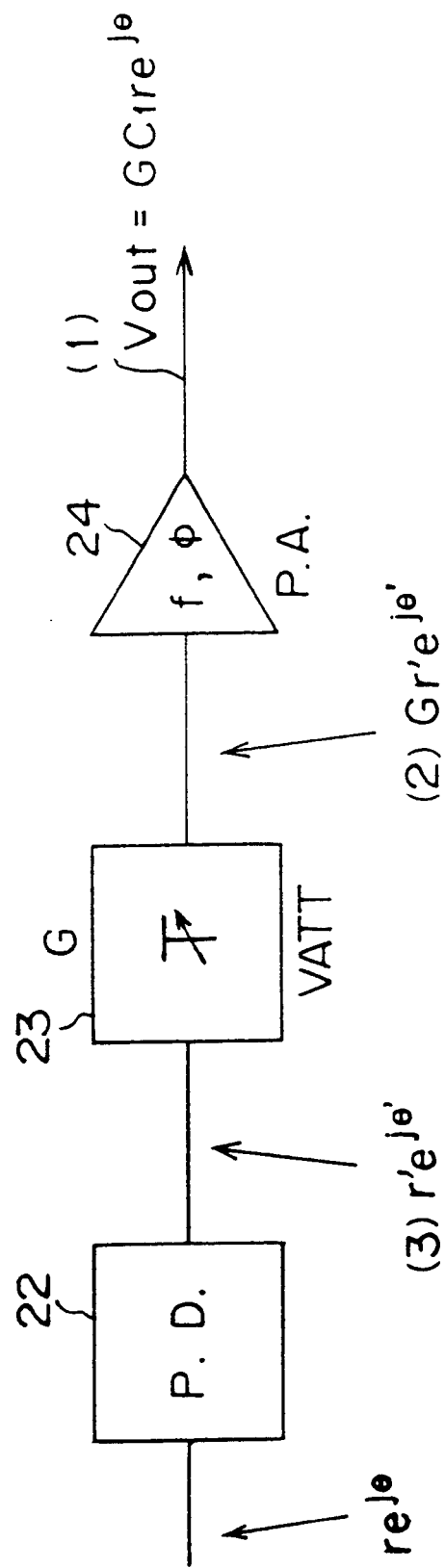
FIG. 9 is a drawing showing the influence on a pre-distortion function of the gain of a variable attenuator.

FIG. 9 is a drawing showing the influence on a pre-distortion function of the gain G of a variable attenuator (VATT).

If an input signal to a pre-distortion circuit 22 is assumed to be $r \cdot \exp(j\theta)$, a signal desired as the output of a PA 24 is $Gc_1 \cdot r \cdot \exp(j\theta)$, which is obtained by multiplying the input signal by a constant. If the output (signal (3)) of the pre-distortion circuit 22 is assumed to be $r' \cdot \exp(j\theta')$, the output (signal (2)) of a variable attenuator 23 becomes $Gr' \cdot \exp(j\theta')$. Therefore, the output (signal (1)) of the PA 24 becomes $f(Gr') \cdot \exp(j(\theta' + \phi(Gr')))$. In order to obtain $Gc_2 \cdot r \cdot \exp(j\theta)$ from the output (signal (1)) of the PA 24, the following equations (10) through (12) must be satisfied.

$$r' = \frac{f^{-1}(Gc_1 r)}{G} \quad (10)$$

$$\theta' = \theta - \phi(Gr') = \theta_{pd}(Gr') \quad (11)$$

$$f^{-1}(Gc_1 r) = F_{pd}(Gr) = Gr + \Delta_{pd}(Gr) \therefore r' = r + \frac{\Delta_{pd}(Gr)}{G} \quad (12)$$

In equations (11) and (12), G is the gain of the variable attenuator, r and θ are an amplitude signal and a phase signal, respectively, before being inputted to the pre-distortion circuit 22, and r' and θ' are an amplitude signal and a phase signal after pre-distortion by the pre-distortion circuit 22, respectively. Therefore, since pre-distortion to be performed is given by equations (11) and (12), it is sufficient if these equations are realized.

According to FIG. 8, since $(\Delta_{pd}(Gr))/G$ is obtained in the amplitude pre-distortion unit 20 and $(\Delta_{pd}(Gr))/G$ is added to the amplitude signal r in the adder 5, the pre-distortion of equation (12) is performed by both the amplitude pre-distortion unit 20 and the adder 5. However, since Gr' is obtained by a multiplier 21 and a phase pre-distortion unit 3 performs a phase pre-distortion using Gr' as an input, equation (11) can be realized using the configuration of the phase pre-distortion unit 3. As described earlier, in this case, the phase pre-distortion is performed only by subtracting the phase characteristic value $\phi(Gr')$ of the PA 2 from the original phase signal θ.

Figure 10:
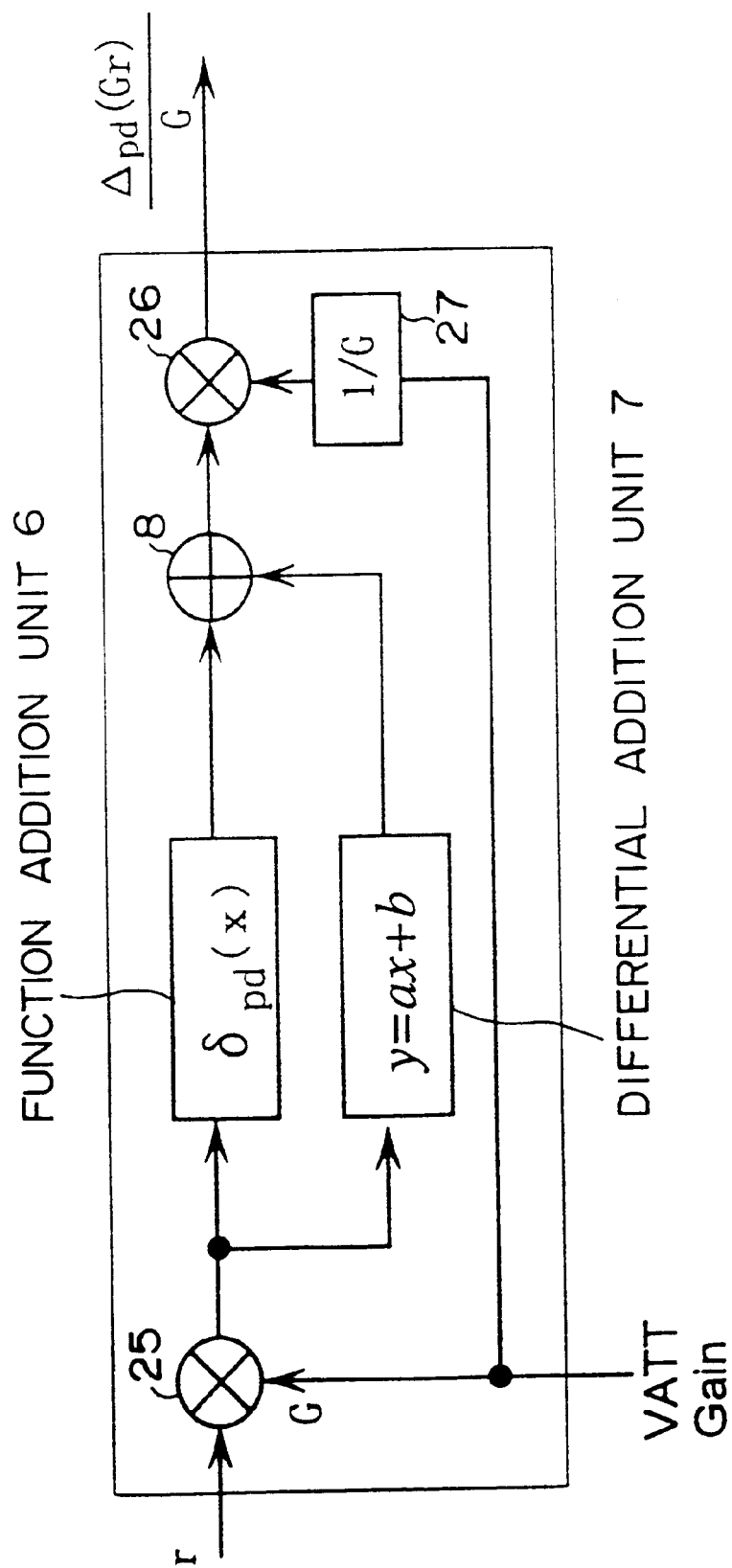
FIG. 10 shows the configuration of the amplitude pre-distortion unit 20 shown in FIG. 8.

FIG. 10 shows the internal configuration of the amplitude pre-distortion unit 20 shown in FIG. 8.

In FIG. 10, the same reference numbers are attached to the same elements as those used in FIG. 6B.

Since a Δ function is given by equation (2), in this preferred embodiment, both a δ function addition unit 6 and a differential addition unit 7 are also provided, as shown in FIG. 6B. However, since in this preferred embodiment, both the input x of the δ function and the input x of y=ax+b can be obtained by multiplying the amplitude r by the gain G of the variable attenuator, the amplifier signal r is multiplied by the gain G in a multiplier 25 using the gain of the variable attenuator as an input, and the multiplication result is inputted to both the δ function addition unit 6 and differential addition unit 7. Then, the output from the δ function addition unit 6 and the output of the differential addition unit 7 are added in the adder 8, as shown in FIG. 6B. Furthermore, as shown in equation (12), since the Δ function must be multiplied 1/G times, the inputted gain G of the variable attenuator is converted to 1/G by a converter 27, the conversion result is multiplied by the output from the adder 8 in a multiplier 26 and the multiplication result is outputted.

Figure 11:
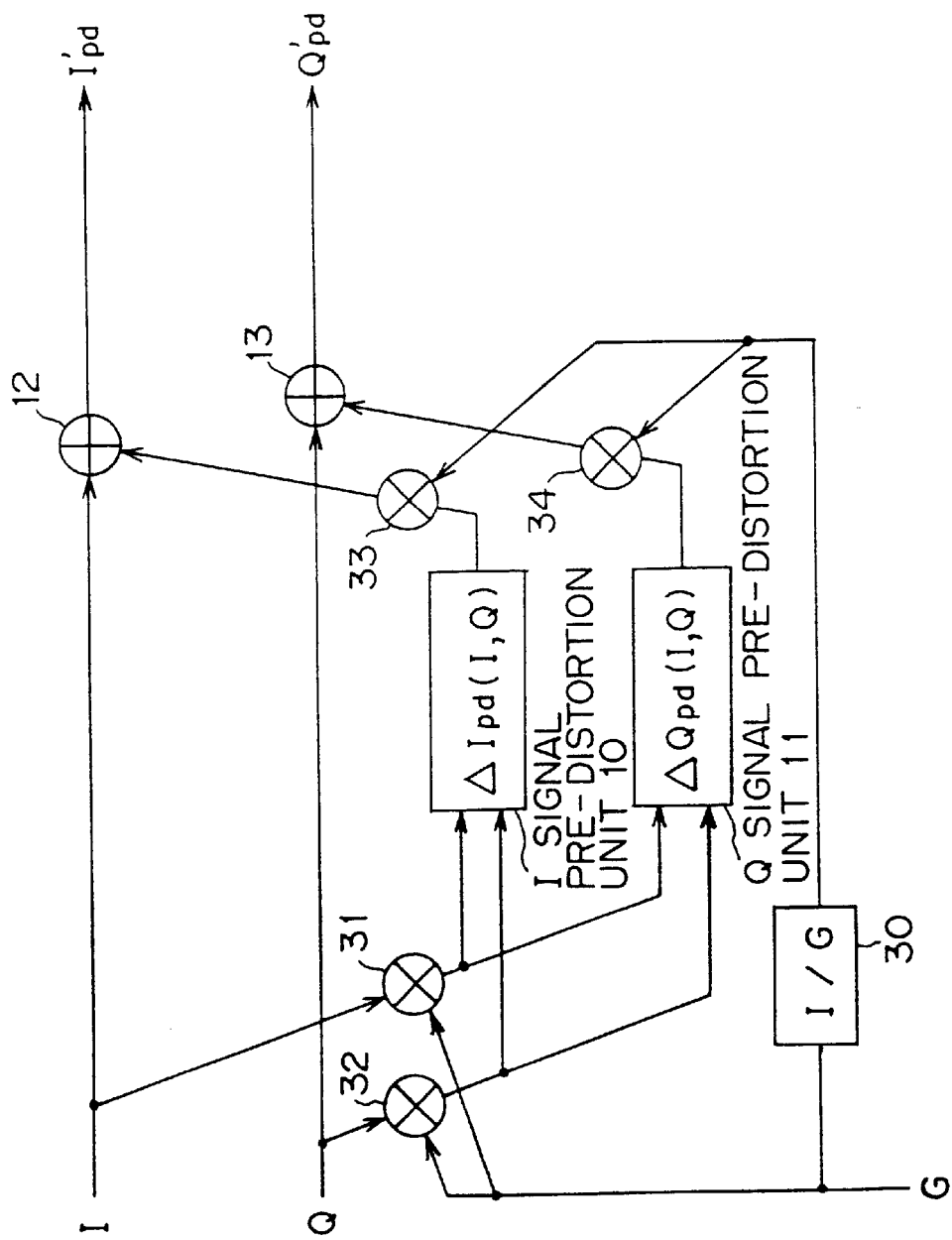
FIG. 11 shows the configuration of the fourth preferred embodiment of the pre-distortion circuit of the present invention.

FIG. 11 shows the configuration of the fourth preferred embodiment of the pre-distortion circuit of the present invention.

In FIG. 11, the same reference numbers are attached to the same elements as those used in FIG. 7.

In this preferred embodiment, inputted I and Q signals are inputted to multipliers 31 and 32, respectively, without coordinate transformation. The gain G of the variable attenuator is inputted to the multipliers 31 and 32, and the I and Q signals are multiplied G times by the multipliers 31 and 32, respectively. The I signal pre-distortion unit 10 and the Q signal pre-distortion unit 11 respectively perform equations (8) and (9), described earlier using the G times-multiplied I and Q signals as inputs, respectively, and output a $\Delta I_{pd}$ value and a $\Delta Q_{pd}$ value, respectively. These outputs are multiplied by the output 1/G of a converter 30 to which the gain G of the variable attenuator is inputted in multipliers 33 and 34, respectively, and the respective multiplication result is added to the I and Q signals in adders 12 and 13, respectively. As a result of this addition, an I signal after pre-distortion $I_{pd}$ and an Q signal after pre-distortion $Q_{pd}$ are outputted as the outputs of the pre-distortion circuit. A series of these processes are expressed as follows, and it is understood that equations (13) and (14) respectively correspond to equations (10) and (11), described earlier.

$$\Delta I_{pd}(GI, GQ) = F_{pd}\left(G\sqrt{I^2 + Q^2}\right)\cos(\theta_{pd}(GI, GQ)) - GQ \quad (13)$$

$$\Delta Q_{pd}(GI, GQ) = F_{pd}\left(G\sqrt{I^2 + Q^2}\right)\sin(\theta_{pd}(GI, GQ)) - GQ \therefore$$

$$I_{pd} = I + \frac{\Delta I_{pd}(GI, GQ)}{G} = \frac{F_{pd}\left(G\sqrt{I^2 + Q^2}\right)}{G}\cos(\theta_{pd}(GI, GQ))$$

$$Q_{pd} = Q + \frac{\Delta Q_{pd}(GI, GQ)}{G} = \frac{F_{pd}\left(G\sqrt{I^2 + Q^2}\right)}{G}\sin(\theta_{pd}(GI, GQ)) \therefore$$

$$r' = \frac{F_{pd}\left(G\sqrt{I^2 + Q^2}\right)}{G}$$

$$\tan\theta' = \tan(\theta_{pd}(GI, GQ)) \quad (14)$$

As described with reference to FIG. 7, the I signal pre-distortion unit 10 and Q signal pre-distortion unit 11 can be configured by way of hardware using a sin function table and a cos function table and combining the tables with a multiplier, subtracter, etc., or can be realized by way of software using a CPU (central processing unit).

Figure 12:
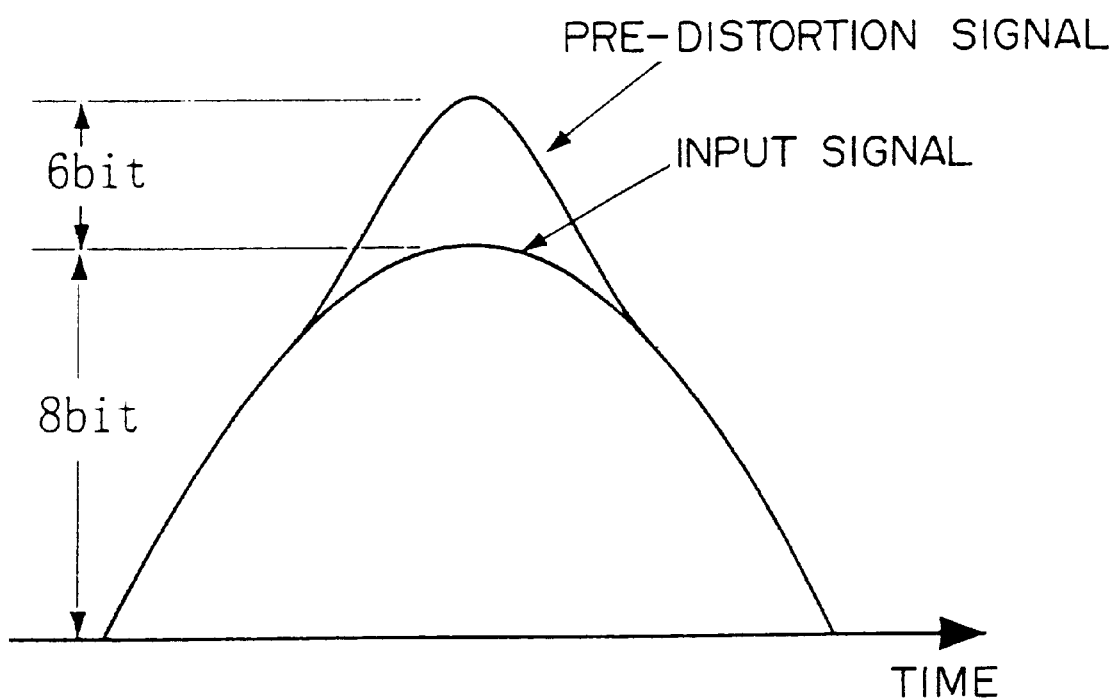
FIG. 12 shows an A/D conversion method in the preferred embodiment of the present invention.

FIG. 12 shows an A/D conversion method in the preferred embodiment of the present invention.

In this preferred embodiment, since an input signal and a differential pre-distortion signal to be combined with the input signal ($\Delta$ function, etc.,) are separately handled, the number of quantization bits of each signal can be adjusted. For this reason, an optimization, such as one reducing the memory capacity of a memory device needed in a function table by reducing the number of quantization bits of a differential pre-distortion signal only, can be realized.

FIG. 12 shows the typical hourly change of an input signal and a differential pre-distortion signal. As is clearly seen from the preferred embodiment described earlier, a pre-distortion signal is obtained by adding the input signal and differential pre-distortion signal. Therefore, the input signal and differential pre-distortion signal can be independently A/D-converted. For example, if eight bits and six bits are assigned to the input signal and the differential pre-distortion signal, respectively, and the analog signals of the input signal and differential pre-distortion signal are converted to digital signals, all the signals after pre-distortion are digitized with an accuracy of eight bits or more, thus realizing a pre-distortion process with fewer quantization errors. Besides, since only six bits are assigned to the differential pre-distortion signal requiring a function table, this preferred embodiment has an effect of reducing the memory capacity of the function table.

Figure 13:
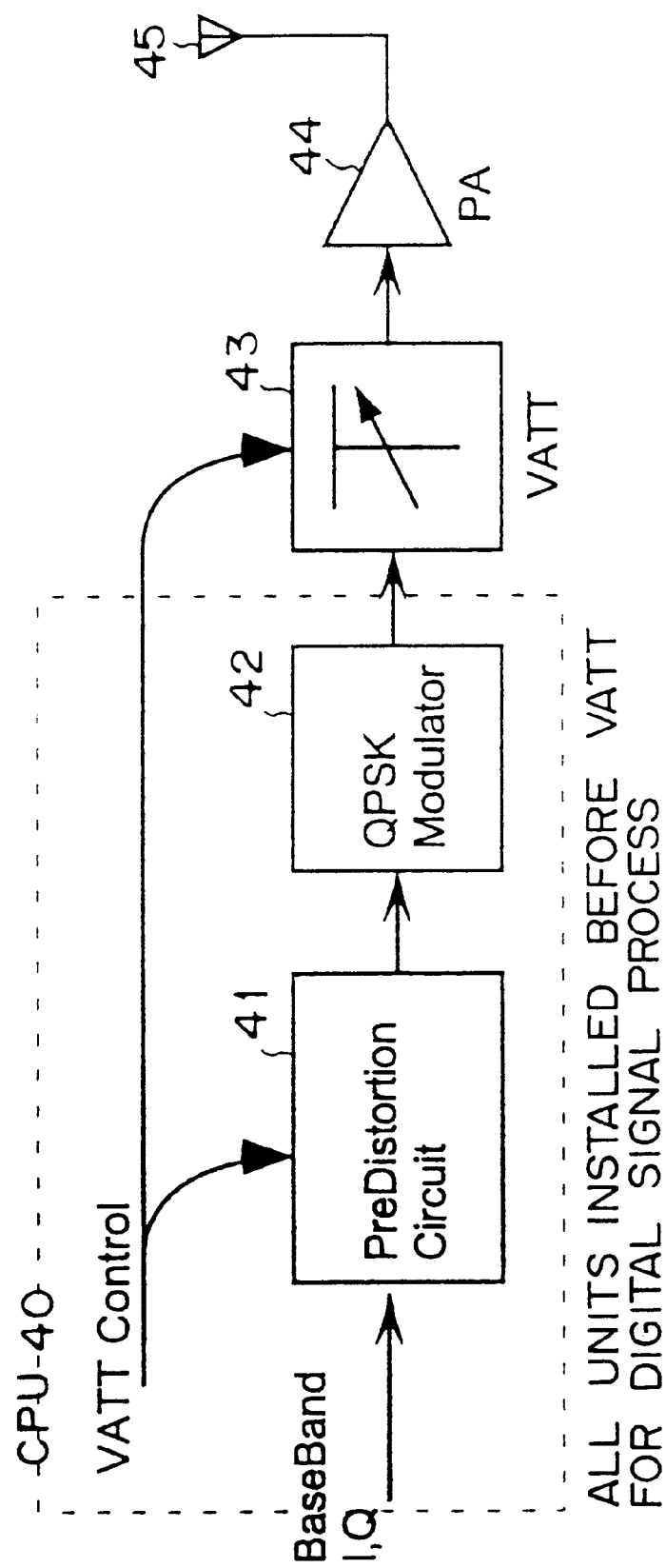
FIG. 13 shows the configuration of the fifth preferred embodiment of the pre-distortion circuit of the present invention.

FIG. 13 shows the configuration of the fifth preferred embodiment of the pre-distortion circuit of the present invention.

In this preferred embodiment, a digital signal process using a CPU 40 is realized including a pre-distortion circuit 41 and a QPSK modulator. In even such a configuration, the contraction of pre-distortion information is effective in reducing the circuit scale. The CPU 40 executes a process to be executed by the pre-distortion circuit 41 for inputted baseband I and Q signals by way of software. The CPU 40 also executes the QPSK modulation process of the QPSK modulator by way of software. The modulation signal obtained in this way is inputted to a variable attenuator 43, is amplified by a PA 44 after being adjusted by the variable attenuator 43 and is transmitted from an antenna 45. Gain information (gain value G itself) for adjusting the gain of the variable attenuator 43, etc., is inputted to the CPU 40, and the CPU 40 executes the pre-distortion process described earlier for the baseband I and Q signals. Then, the CPU 40 applies a QPSK modulation to the pre-distorted I and Q signals.

The reduction method of a memory capacity described above can also be effectively applied to so-called software radio technology by which a process using an analog circuit is replaced with a digital signal process.

Figure 14:
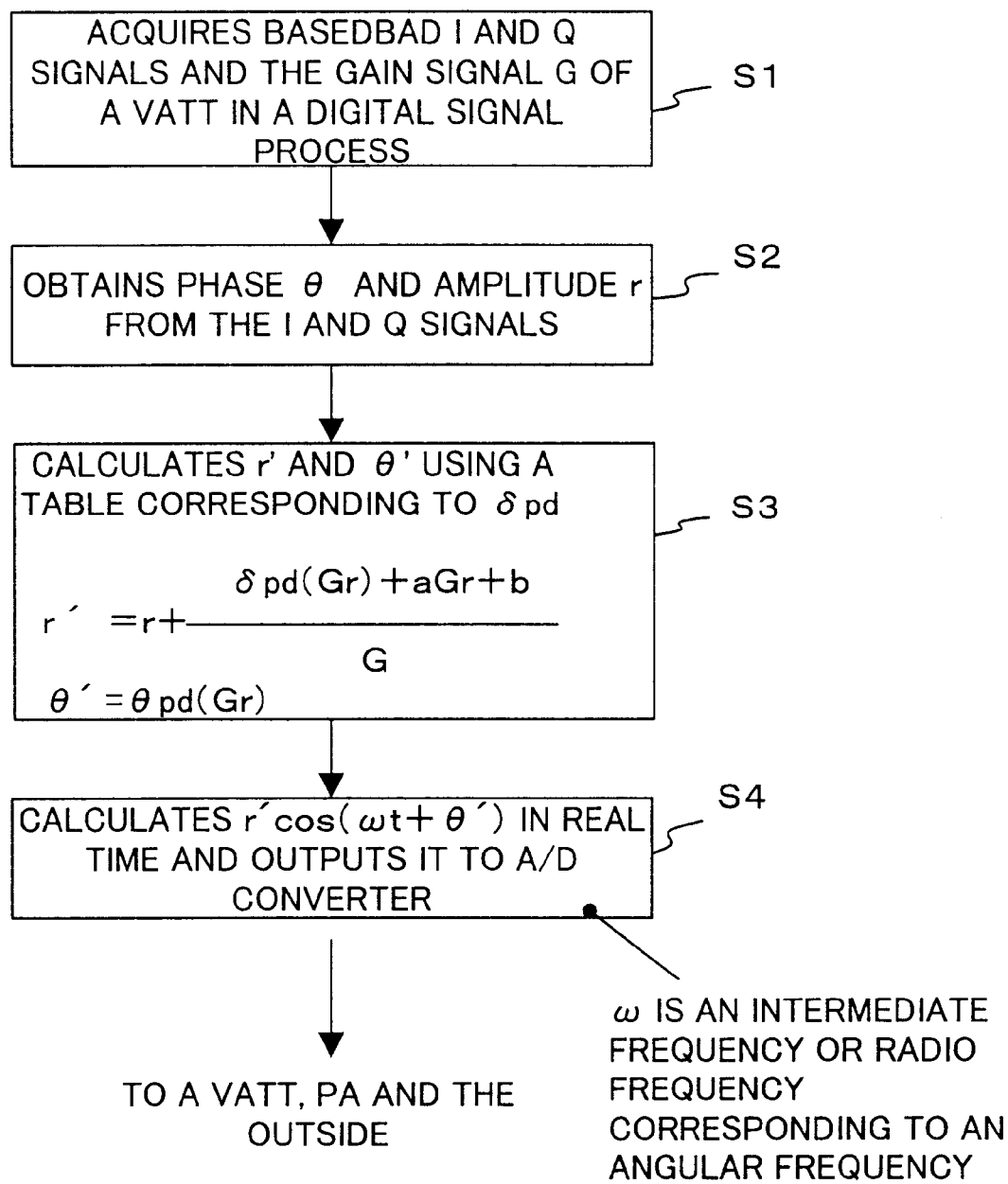
FIG. 14 is a flowchart showing the execution process of a CPU (central processing unit) in the fifth preferred embodiment.

FIG. 14 is a flowchart showing the execution process of a CPU in the fifth preferred embodiment described above.

First, in step S1, baseband I and Q signals, and the gain signal G of a variable attenuator are acquired by a digital signal process. Then, in step S2, the process described above is applied to the signal values I and Q of the I and Q signals, and an amplitude value r and a phase value $\theta$ are obtained, respectively. Then, in step S3, an amplitude signal r' and a phase signal $\theta'$ after pre-distortion are calculated using a function table corresponding to $\delta_{pd}$, based on the amplitude value r and phase value $\theta$, respectively. The following equations are used to calculate the amplitude signal r' and phase signal $\theta'$ after pre-distortion.

$$r' = r + \frac{\delta_{pd}(Gr) + aGr + b}{G}$$

$$\theta' = \theta_{pd}(Gr)$$

In these equations, $\theta_{pd}(Gr) = \theta - \phi(Gr')$ is satisfied. In the equations, a and b are constants appropriately set when the function table of a $\delta$ function is prepared.

Then, in step S4, $r'\cdot\cos(\omega t + \theta')$ is calculated using both the amplitude signal r' and phase signal $\theta$ obtained by the pre-distortion process, and $r'\cdot\cos(\omega t + \theta')$ is outputted to a D/A converter, which is not shown in FIG. 13. $\omega$ is an angular frequency corresponding to an intermediate frequency or radio frequency, and the calculation of $\cos(\omega t + \theta')$ corresponds to a QPSK modulation. The modulation signal obtained in step S4 is transferred to devices subsequently installed, such as a variable attenuator, PA, etc., and is transmitted from an antenna. Since at this point, the amplitude and phase characteristics of the variable attenuator and PA are already compensated for by pre-distortion, signals with signal distortion and adjacent channel leak power that are suppressed, are transmitted from the antenna.

Figure 15:
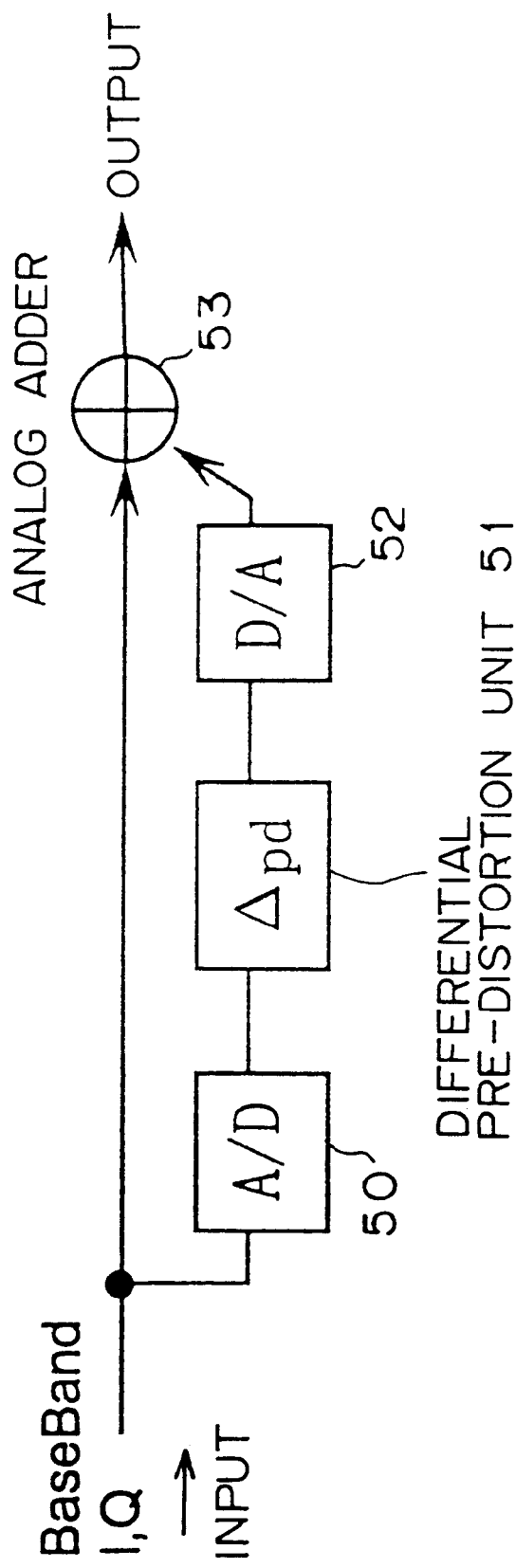
FIG. 15 shows the configuration of the sixth preferred embodiment of the pre-distortion circuit of the present invention.

FIG. 15 shows the configuration of the sixth preferred embodiment of the pre-distortion circuit of the present invention.

In the first through fifth preferred embodiments, described earlier, it is presumed that an input signal is processed after digital conversion. However, considering that a quantization error occurs due to the digital conversion, it is preferable not to digitize the input signal to be inputted to an adder since the quantization error does not occur if the input signal is not digitized.

Therefore, in the sixth preferred embodiment, baseband I and Q signals to be directly inputted to the adder are passed through without A/D conversion, and are combined with a differential pre-distortion signal (Δ function value) obtained by D/A-converting these analog signals in an analog way. The pre-distortion function shown in FIG. 15 also compensates for the characteristic of a VATT or QPSK modulator installed before a PA.

Specifically, baseband I and Q signals, which are input signals, are inputted to an analog adder 53 as analog signals. The I and Q analog signals are also inputted to an A/D converter 50, and are converted to digital signals by I and Q digital signals inputted from the A/D converter 50. Then, in a differential pre-distortion unit 51, differential pre-distortion signals $\Delta_{pd}$ are digitally generated using the function table of a δ function digitally stored. These differential pre-distortion signals $\Delta_{pd}$ are converted to analog signals by a D/A converter 52, and are added to the I and Q input signals in the analog adder 53.

In this way, baseband input signals are directly inputted to the analog adder 53 as analog signals without A/D conversion, and if the baseband I and Q input signals are combined with the differential pre-distortion signal $\Delta_{pd}$ obtained by converting these baseband I and Q analog input signals to analog signals in the analog adder 53, the quantization error of the input signals can be eliminated, thus, in particular, improving the characteristic at the time of a small signal.

Figure 16:
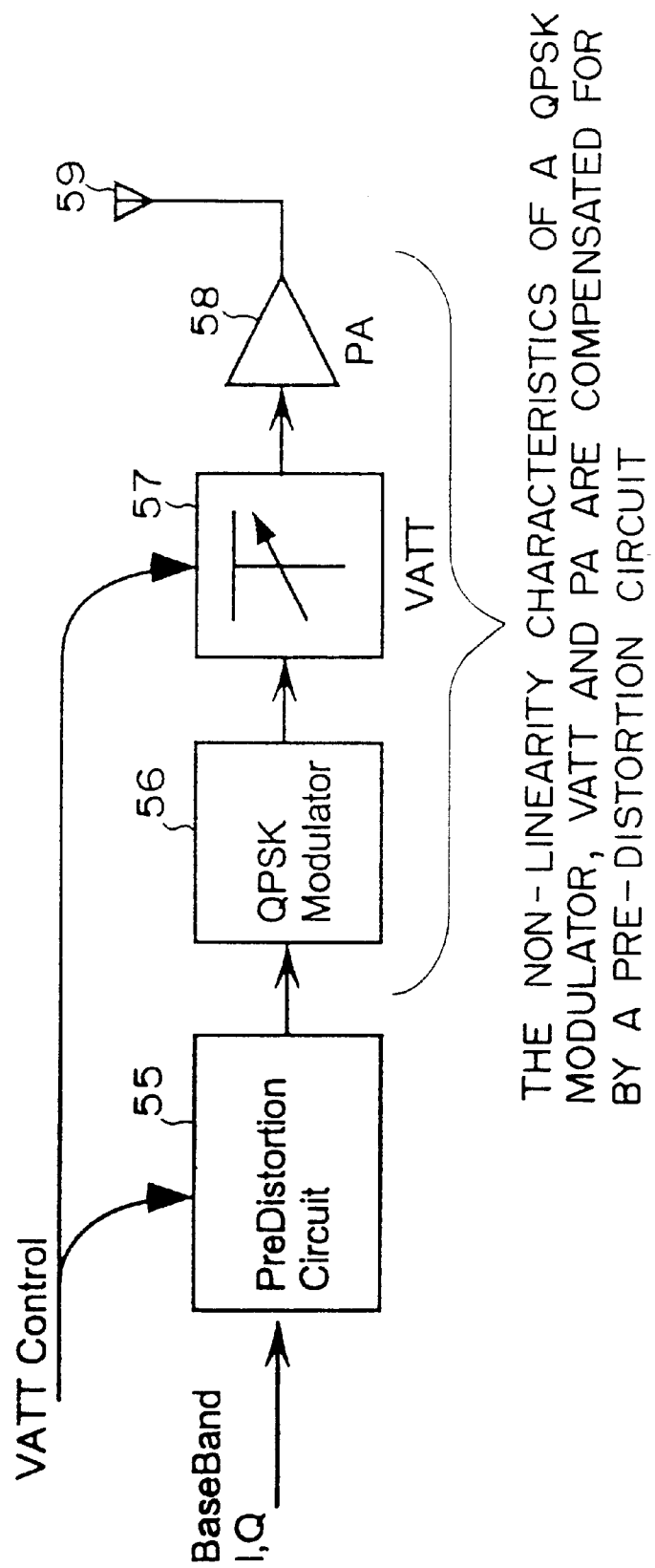
FIG. 16 shows the configuration of the seventh preferred embodiment of the pre-distortion circuit of the present invention.

FIG. 16 shows the configuration of the seventh preferred embodiment of the pre-distortion circuit of the present invention.

In the preferred embodiments of the pre-distortion circuit described above, it has been described that if the pre-distortion process is executed taking into consideration both the amplitude and phase characteristics of a PA and the gain of a variable attenuator, effective pre-distortion can be performed. In the seventh preferred embodiment, if a QPSK modulator 56 is provided separately from a pre-distortion circuit 55, the pre-distortion is performed further taking into consideration the amplitude and phase characteristics of this QPSK modulator 56. In this case, the amplitude and phase characteristics of the QPSK modulator 56 are experimentally obtained in advance, and the data stored in the function table of the differential pre-distortion function of the pre-distortion circuit 55 are modified in advance in such a way that a pre-distortion is performed including the experimentally obtained amplitude and phase characteristics of the QPSK modulator 56. By doing so, signals obtained by compensating for all the characteristics of all the units installed after the pre-distortion circuit 55 (a QPSK modulator 56, a variable attenuator 57 and a PA 58) can be transmitted from an antenna 59. Specifically, signals with signal distortion and adjacent channel leak power that are suppressed can be transmitted, thereby realizing higher-quality communications.

By measuring in advance amplitude and phase characteristics including an A/D converter, etc., which is not shown in FIG. 16, but will be included in an actual circuit, in addition to the units described above and reflecting the measurement result on the differential pre-distortion function, higher-quality signals can be transmitted and received.

Figures 17A, 17B:
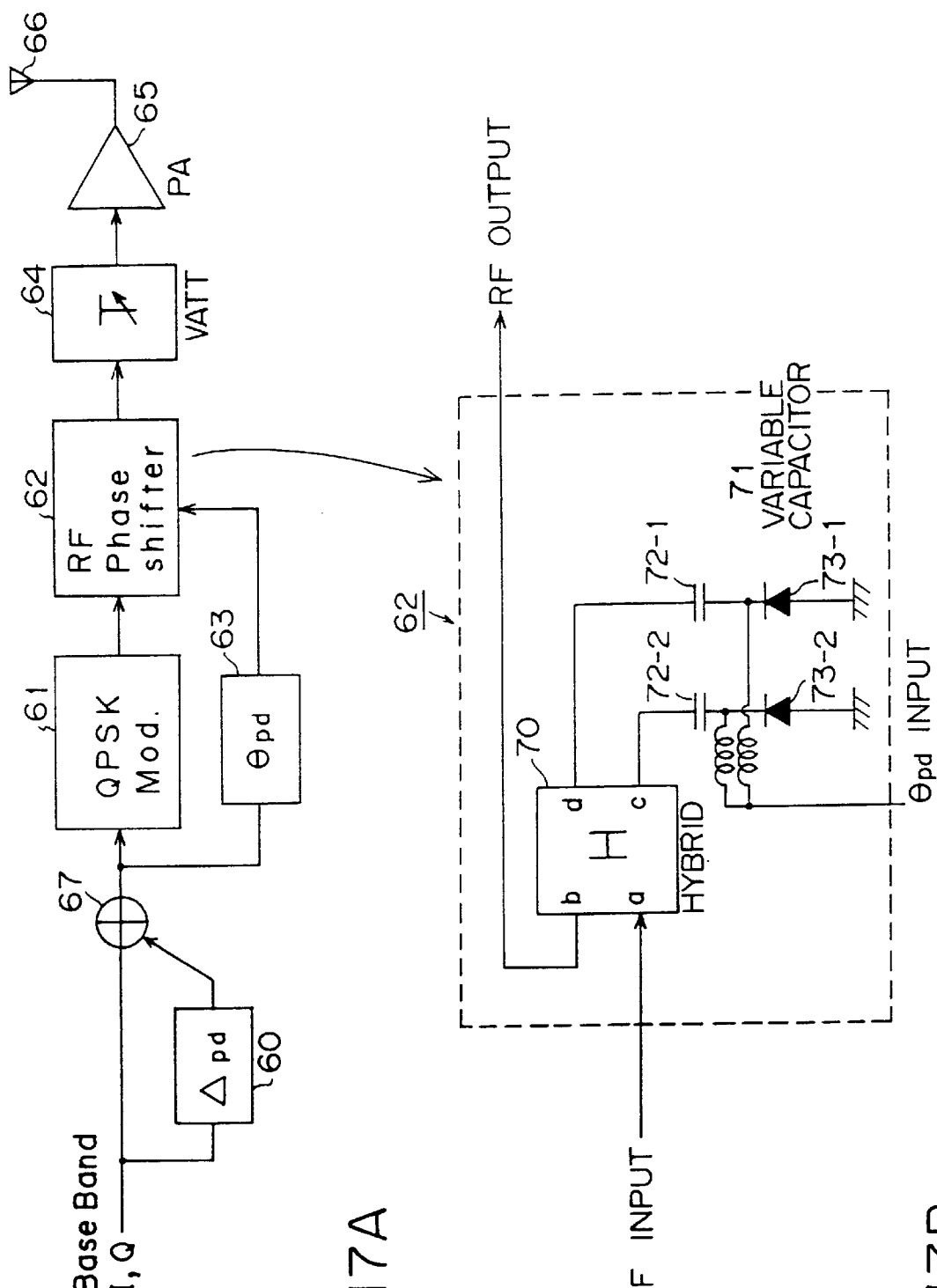
FIGS. 17A and 17B show the configuration of the eighth preferred embodiment of the pre-distortion circuit of the present invention.

FIGS. 17A and 17B show the configuration of the eighth preferred embodiment of the pre-distortion circuit of the present invention.

In this preferred embodiment, after a compensation for amplitude (pre-distortion) is performed by a differential pre-distortion circuit 60, a compensation for phase (pre-distortion) is performed by an RF phase shifter 62.

Specifically, only the compensation for amplitude is performed in a baseband, and the compensation for phase is made by an RF analog phase shifter. With this configuration, since a baseband phase shifter requiring a plurality of digital multipliers with a fairly large circuit scale is not required, the overall circuit scale can be reduced.

FIG. 17A shows the configuration of this preferred embodiment.

Baseband I and Q signals are directly inputted to an analog adder 67 and are also inputted to the differential pre-distortion circuit 60. The differential pre-distortion circuit 60 outputs an amplitude pre-distortion signal, and the outputted pre-distortion signal is added to the baseband I and Q input signals in the adder 67. In FIG. 17A, an A/D converter and a D/A converter are not shown. The A/D and D/A converters are installed immediately before or after the differential pre-distortion circuit. Alternatively, the baseband I and Q input signals can be converted to digital signals once, the amplitude values can be pre-distorted by the differential pre-distortion circuit 60 and the addition result of the adder 67 with a system that is replaced with a digital system, can be D/A-converted to analog signals.

The output of the adder 67 is modulated into RF signals by a QPSK modulator 61, and the RF signals are inputted to an RF phase shifter 62. The output of the adder 67 is also inputted to a phase pre-distortion circuit 63, and a phase pre-distortion signal generated by the phase pre-distortion circuit 63 is inputted to the RF phase shifter 62. The RF phase shifter 62 shifts the phase of the modulated RF signals and outputs the modulated RF signals. Thus, a phase pre-distortion is performed. The power of the signals with amplitude and phase that are pre-distorted are adjusted by a variable attenuator 64, are amplified in a PA 65 and are transmitted from an antenna 66.

FIG. 17B shows an example configuration of the above-described RF phase shifter 62.

The RF signals outputted from the QPSK modulator 61 are inputted to the terminal a of the hybrid 70 of the RF phase shifter 62. The RF signals inputted to the hybrid 70 are branched and outputted from terminals c and d. One end of each of capacitors 72-1 and 72-2 is connected to each of terminals c and d, respectively. The cathode of each of variable diodes 73-1 and 73-2, with anodes that are grounded, is connected to the other end of each of the capacitors 72-1 and 72-2, respectively. As shown in FIG. 17B, a phase pre-distortion signal $\theta_{pd}$ is applied both between the capacitor 72-1 and diode 73-1, and between the capacitor 72-2 and diode 73-2. Thus, the voltages on the grounding side of the capacitors 72-1 and 72-2 become different from each other. Although the RF signals outputted from the terminals c and d are reflected on the capacitors 72-1 and 72-2, respectively, a phase difference occurs between the RF signals when the RF signals are reflected due to the difference between the voltage on the grounding side of the capacitor 72-1 and the voltage on the grounding side of the capacitor 72-2. In this way, the respective reflected RF signals are inputted to the terminals c and d, respectively. Then, the RF signals that have respective phases that are shifted against the RF input signals by the phase difference generated as described above, are outputted from the terminal b of the hybrid 70. In this way, the RF phase shifter 62 can output the RF signals with phases that are shifted.

The details of the operations of both the hybrid 70 and a variable capacitor 71 will be understandable to a person having an ordinary skill in the art.

Figure 18:
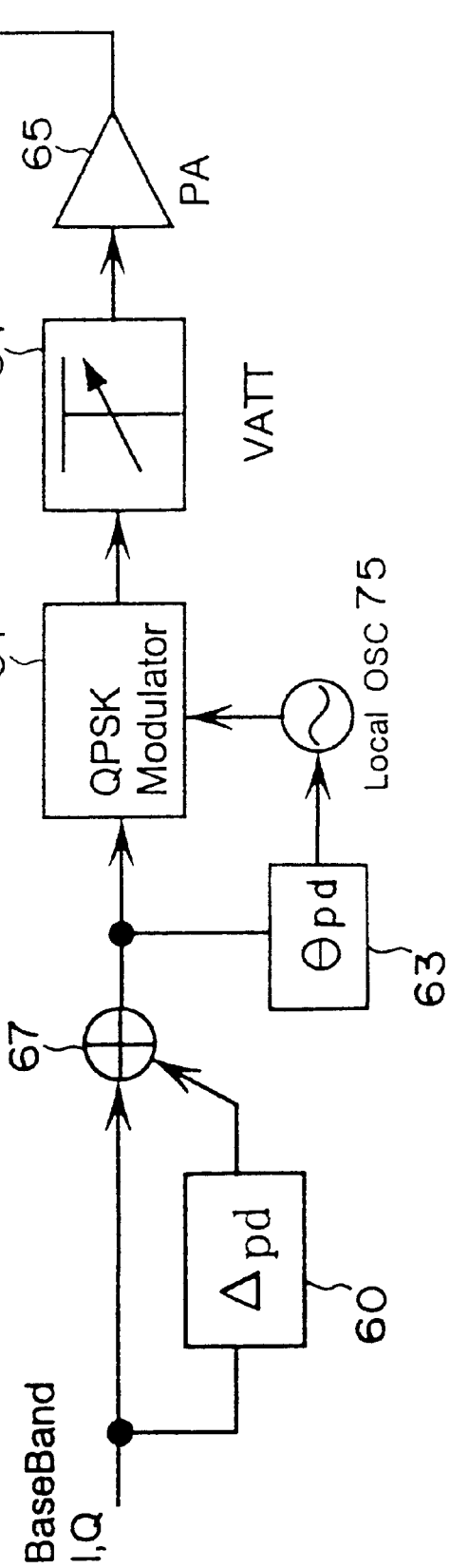
FIG. 18 shows the configuration of the ninth preferred embodiment of the pre-distortion circuit of the present invention.

FIG. 18 shows the configuration of the ninth preferred embodiment of the pre-distortion circuit of the present invention.

In FIG. 18, the same reference numbers are attached to the same elements as those used in FIG. 17A.

In this preferred embodiment, a pre-distortion is applied to the phase of an IF signal by shifting the phase of the originating signal of a local oscillator 75, which is not shown in the drawings for the above-described preferred embodiments, but in actual practice it is usually installed when a baseband signal is converted to the IF signal or RF signal, of the QPSK modulator 61 after the amplitude is compensated for by the differential pre-distortion circuit 60.

Inputted baseband I and Q signals are inputted to the adder 67 and are also inputted to the differential pre-distortion circuit 60. The output of the differential pre-distortion circuit 60 is inputted to the adder 67, and is added to the I and Q input signals in the adder 67. In FIG. 18, A/D and D/A converters are not shown as in FIG. 17A.

The output of the adder 67 is inputted to the QPSK modulator and is QPSK-modulated. The output of the adder 67 is branched and is also inputted to a phase pre-distortion circuit 63. The phase pre-distortion circuit 63 provides the local oscillator 75 of the QPSK modulator 61 with the amount of phase pre-distortion to be given to the baseband I and Q signals, and shifts the phase of signals outputted by the local oscillator 75. By shifting the phase of the output from the local oscillator 75, the baseband I and Q signals to be modulated in the QPSK modulator 61 can be adjusted, and the same effect obtained when a pre-distortion is applied can be obtained. The IF modulation signals generated in this way are inputted to a variable attenuator 64 through an IF/RF converter, which is not shown, are amplified in a PA 65 after the output is adjusted in the variable, attenuator 64, and are transmitted from an antenna 66.

In this preferred embodiment, the local oscillator 75 is assumed to output signals of IF frequencies.

Figure 19:
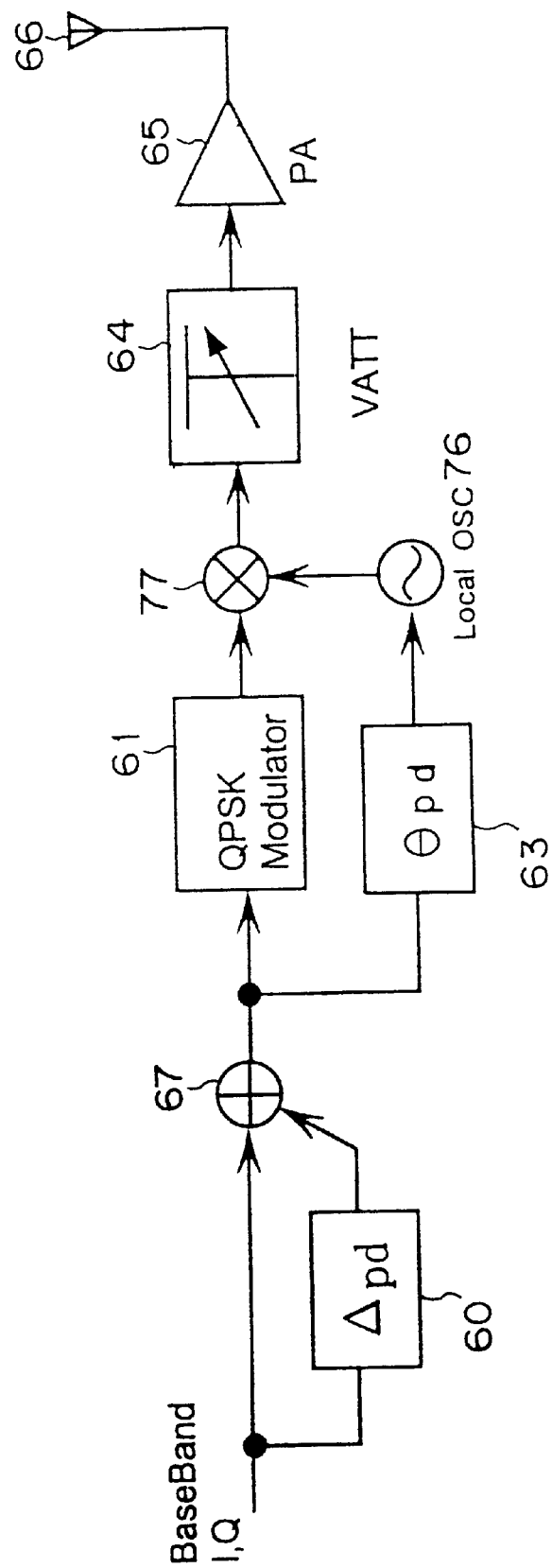
FIG. 19 shows the configuration of the tenth preferred embodiment of the pre-distortion circuit of the present invention.

FIG. 19 shows the configuration of the tenth preferred embodiment of the pre-distortion circuit of the present invention.

In FIG. 19, the same reference numbers are attached to the same elements as those described in FIG. 17A.

In this preferred embodiment, the phase pre-distortion of an RF signal is performed by shifting the phase of the local oscillator 76 of a frequency mixer 77 after the amplitude is compensated for by a differential pre-distortion circuit 60.

An amplitude pre-distortion is applied to inputted baseband I and Q signals by both the differential pre-distortion circuit 60 and adder 67. As with the eighth and ninth preferred embodiments described above, A/D and D/A converters are not shown in this configuration shown in FIG. 19.

The output of the adder 67 is modulated by a QPSK modulator 61 and is converted to IF signals. Since in the configuration shown in FIG. 19, the local oscillator of the QPSK modulator 61 shown in FIG. 18 is not used for phase shift, the local oscillator is not shown in FIG. 19. The IF signals outputted from the QPSK modulator are inputted to a frequency mixer 77. However, the branched output of the adder 67 is inputted to a phase pre-distortion circuit 63, and a phase pre-distortion signal generated by the phase pre-distortion circuit 63 is inputted to the local oscillator 76. The local oscillator 76 is used to convert IF signals to RF signals, and outputs RF frequency band signals. The local oscillator 76 shifts the phase of the outputted RF frequency band signal based on the phase pre-distortion signal from the phase pre-distortion circuit 63 and provides the frequency mixer 77 with the RF frequency band signal. In this way, the IF signals outputted from the QPSK modulator 61 are converted to RF signals in the frequency mixer 77, and simultaneously are phase-pre-distorted and inputted to the variable attenuator 64. The RF signals with outputs that are adjusted in the variable attenuator 64 are amplified in the PA 65 and are transmitted from an antenna 66.

Figure 20:
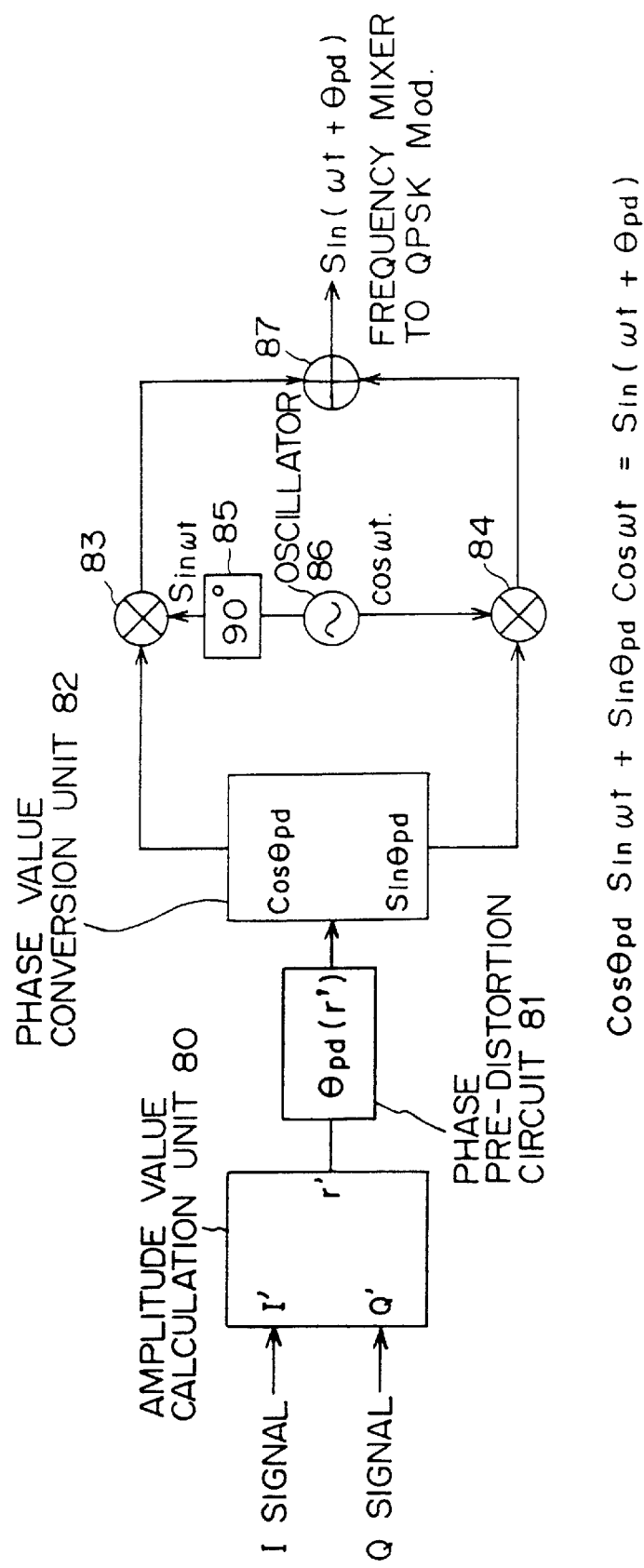
FIG. 20 shows the configuration of local oscillators in the ninth and tenth preferred embodiments.

FIG. 20 shows the configuration of local oscillators 75 and 76 in the ninth and tenth preferred embodiments.

When baseband I and Q signals for which an amplitude pre-distortion process is performed are inputted to the terminals I' and Q' of an amplitude value calculation unit 80, respectively, an amplitude value r' is calculated from the inputted I and Q signals in an amplitude value calculation unit 80. Although in the configurations of the ninth and tenth preferred embodiments, shown in FIGS. 15 and 16, this amplitude value calculation unit 80 is not shown, the amplitude value calculation unit 80 should be installed in an actual circuit according to the configurations shown in FIGS. 15 and 16.

The amplitude value r' calculated in the amplitude value calculation unit 80 is inputted to a phase pre-distortion circuit 81, and a phase pre-distortion signal $\theta_{pd}$ is generated in the phase pre-distortion circuit 81. The phase pre-distortion signal $\theta_{pd}$ is converted to $\cos\theta_{pd}$ and $\sin\theta_{pd}$ in a phase value conversion unit 82, and $\cos\theta_{pd}$ and $\sin\theta_{pd}$ are inputted to multipliers 83 and 84, respectively. The cosine wave $\cos(\omega t)$ of a prescribed angular frequency $\omega$ is outputted from a local oscillator 86. The value of cosine wave $\cos(\omega t)$ of angular frequency $\omega$ should be appropriately set depending on whether the local oscillator 86 shown in FIG. 20 is used to convert baseband signals to IF band signals (in the case of a local oscillator 75) or to convert baseband signals from IF signals to RF signals (in the case of a local oscillator 76). Cosine wave $\cos(\omega t)$ outputted from the local oscillator 86 is directly inputted to the multiplier 84. Simultaneously the phase of cosine wave $\cos(\omega t)$ is shifted by 90 degrees, the cosine wave $\cos(\omega t)$ is converted to $\sin(\omega t)$ and is also inputted to the multiplier 83. $\sin(\omega t)$ and $\cos(\omega t)$ inputted to the multipliers 83 and 84, respectively, are multiplied by the output from a phase value conversion unit 82 in the multipliers 83 and 84, respectively, and the two multiplication results are added in an adder 87. Then, an operation shown on the left side of the following equation is performed in the adder 87, and frequency $\sin(\omega t+\theta_{pd})$ obtained by shifting the phase of the frequency by a phase pre-distortion value $\theta_{pd}$, is generated.

$$\cos\theta_{pd}\cdot\sin(\omega t)+\sin\theta_{pd}\cdot\cos(\omega t)=\sin(\omega t+\theta_{pd})$$

As described above, since the phase of a signal generated by performing a QPSK modulation or frequency mixing using frequency $\sin(\omega t+\theta_{pd})$ with a phase that is shifted, is shifted by a phase pre-distortion value $\theta_{pd}$, a phase pre-distortion can be efficiently applied in the ninth and tenth preferred embodiments.

Although in each of the preferred embodiments of the present invention described above, a power amplifier installed in the transmitter of a communications system is targeted, the pre-distortion apparatus or method can also be applied to an amplifier installed in a part of a system other than a communications system.

According to the present invention, by storing only information about the differential between an input signal and a pre-distortion signal or by separating the differential function into an approximation function (y=ax+b) and a correction function and storing only information about the correction function, the memory capacity of information needed for the pre-distortion process can be reduced, thereby realizing the reduction of the circuit scale of a pre-distortion apparatus.

What is claimed is:

1. A pre-distortion apparatus for linearizing an input/output characteristic of a power amplifier, comprising:

a differential pre-distortion unit using a differential between a pre-distortion function for linearizing an input/output characteristic of a power amplifier and a function expressed with a prescribed equation as a differential pre-distortion function and generating a differential pre-distortion signal using the differential pre-distortion function; and a combination unit combining the differential pre-distortion signal with the input signal and outputting a signal obtained by the combination as a signal after pre-distortion, wherein said differential pre-distortion unit stores a differential between the pre-distortion function and two functions y=x and y=ax+b (x: an input signal value, y: an output signal value, a and b: constants) as the differential pre-distortion, function, and generates a differential pre-distortion signal using the differential pre-distortion function against the input signal.

2. A pre-distortion apparatus for linearizing an input/output characteristic of a power amplifier, comprising:

a differential pre-distortion unit using a differential between a pre-distortion function for linearizing an input/output characteristic of a power amplifier and a function expressed with a prescribed equation as a differential pre-distortion function and generating a differential pre-distortion signal using the differential pre-distortion function; and a combination unit combining the differential pre-distortion signal with the input signal and outputting a signal obtained by the combination as a signal after pre-distortion, wherein said pre-distortion apparatus adjusts and optimizes a respective number of quantization bits of the input signal and the differential pre-distortion signal.

3. A pre-distortion apparatus for linearizing an input/output characteristic of a power-amplifier, comprising:

a differential pre-distortion unit using a differential between a pre-distortion function for linearizing an input/output characteristic of a power amplifier and a function expressed with a prescribed equation as a differential pre-distortion function and generating a differential pre-distortion signal using the differential pre-distortion function;

a combination unit combining the differential pre-distortion signal with the input signal and outputting a signal obtained by the combination as a signal after pre-distortion; and a phase pre-distortion unit performing a phase pre-distortion for a complex IF signal or complex RF signal for which a modulation is performed to transmit signals to the outside, based on an output value from said combination unit, wherein said phase pre-distortion unit performs the phase pre-distortion by adjusting a phase of a local oscillator of a modulator performing the modulation.

4. A pre-distortion apparatus for linearizing an input/output characteristic of a power amplifier, comprising:

a differential pre-distortion unit using a differential between a pre-distortion function for linearizing an input/output characteristic of a power amplifier and a function expressed with a prescribed equation as a differential pre-distortion function and generating a differential pre-distortion signal using the differential pre-distortion function;

a combination unit combining the differential pre-distortion signal with the input signal and outputting a signal obtained by the combination as a signal after pre-distortion; and a phase pre-distortion unit performing a phase pre-distortion for a complex IF signal or complex RF signal for which a modulation is performed to transmit signals to the outside, based on an output value from said combination unit, wherein said phase pre-distortion unit performs the phase pre-distortion by adjusting a phase of a local oscillator of a frequency mixer converting IF signals to RF signals.

5. A pre-distortion method for linearizing an input/output characteristic of a power amplifier, comprising:

(a) using a differential between a pre-distortion function for linearizing an input/output characteristic of a power amplifier and a function expressed with a prescribed equation as a differential pre-distortion function, and generating a differential pre-distortion signal using the differential pre-distortion function; and (b) combining the differential pre-distortion signal with the input signal and outputting a signal obtained by the combination as a signal after pre-distortion, wherein in step (a), a differential between the pre-distortion function and two functions y=x and y=ax+b (x: an input signal value, y: an output signal value, a and b: constants) as the differential pre-distortion function is stored, and a differential pre-distortion signal is generated for the input signal using the differential pre-distortion function.

6. A pre-distortion method for linearizing an input/output characteristic of a power amplifier, comprising:

(a) using a differential between a pre-distortion function for linearizing an input/output characteristic of a power amplifier and a function expressed with a prescribed equation as a differential pre-distortion function, and generating a differential pre-distortion signal using the differential pre-distortion function; and (b) combining the differential pre-distortion signal with the input signal and outputting a signal obtained by the combination as a signal after pre-distortion, wherein a respective number of quantization bits of the input signal and the differential pre-distortion signal are independently adjusted and optimized.

7. A pre-distortion method for linearizing an input/output characteristic of a power amplifier, comprising:

(a) using a differential between a pre-distortion function for linearizing an input/output characteristic of a power amplifier and a function expressed with a prescribed equation as a differential pre-distortion function, and generating a differential pre-distortion signal using the differential pre-distortion function; and (b) combining the differential pre-distortion signal with the input signal and outputting a signal obtained by the combination as a signal after pre-distortion, wherein a phase pre-distortion is performed for a complex IF signal or complex RF signal for which a modulation is performed, to transmit signals to the outside, based on an output value obtained in step (b), and wherein the phase pre-distortion is performed by adjusting a phase of a local oscillator of a modulator performing the modulation.

8. A pre-distortion method for linearizing an input/output characteristic of a power amplifier, comprising:

(a) using a differential between a pre-distortion function for linearizing an input/output characteristic of a power amplifier and a function expressed with a prescribed equation as a differential pre-distortion function, and generating a differential pre-distortion signal using the differential pre-distortion function; and (b) combining the differential pre-distortion signal with the input signal and outputting a signal obtained by the combination as a signal after pre-distortion, wherein a phase pre-distortion is performed for a complex IF signal or complex RF signal for which a modulation is performed, to transmit signals to the outside, based on an output value obtained in step (b), and wherein the phase pre-distortion is performed by adjusting a phase of a local oscillator of a frequency mixer converting IF signals to RF signals.

* * * * *